US009047704B2

(12) United States Patent
Gary

(10) Patent No.: US 9,047,704 B2
(45) Date of Patent: Jun. 2, 2015

(54) METHOD FOR FILLETING 3D MESH EDGES BY SUBIVISION

(75) Inventor: Crocker Gary, San Diego, CA (US)

(73) Assignee: IntegrityWare, Inc., San Diego, CA (US)

( * ) Notice: Subject to any disclaimer, the term of this patent is extended or adjusted under 35 U.S.C. 154(b) by 266 days.

(21) Appl. No.: 13/431,839

(22) Filed: Mar. 27, 2012

(65) Prior Publication Data

US 2013/0262038 A1    Oct. 3, 2013

(51) Int. Cl.
*G06F 17/50*  (2006.01)
*G06T 17/10*  (2006.01)

(52) U.S. Cl.
CPC .............. *G06T 17/10* (2013.01); *G06F 17/50* (2013.01)

(58) Field of Classification Search
CPC ........... G06T 5/00; G06T 1/00; G06T 11/001; G06T 3/40; G06T 11/00; G06T 11/20; G06T 11/60; G06T 17/00; G06T 9/00; G06T 11/206; G06T 13/00; G06T 17/05; G06T 2210/36; G06T 5/003; G06T 5/50; G06T 17/20–17/205
USPC ......... 345/418, 428, 581, 582, 611, 612, 949, 345/955, 947, 419, 606; 703/1–28
See application file for complete search history.

(56) References Cited

U.S. PATENT DOCUMENTS

| | | | |
|---|---|---|---|
| 6,222,553 B1 * | 4/2001 | DeRose et al. | 345/423 |
| 6,515,659 B1 * | 2/2003 | Best et al. | 345/419 |
| 6,876,956 B1 * | 4/2005 | Cirak et al. | 703/2 |
| 7,200,532 B1 * | 4/2007 | Cheng | 703/2 |
| 7,617,079 B2 * | 11/2009 | Stewart et al. | 703/2 |
| 8,120,607 B1 * | 2/2012 | Legakis et al. | 345/423 |
| 2003/0074174 A1 * | 4/2003 | Fu et al. | 703/13 |
| 2003/0218609 A1 * | 11/2003 | Maillot et al. | 345/423 |
| 2005/0084140 A1 * | 4/2005 | Kakadiaris et al. | 382/118 |
| 2007/0030267 A1 * | 2/2007 | Nigro | 345/420 |

(Continued)

OTHER PUBLICATIONS

Jörg Peters. 2000. Patching Catmull-Clark meshes. In Proceedings of the 27th annual conference on Computer graphics and interactive techniques (SIGGRAPH '00). ACM Press/Addison-Wesley Publishing Co., New York, NY, USA, 255-258. DOI=10.1145/344779. 344908 http://dx.doi.org/10.1145/344779.344908.*

(Continued)

*Primary Examiner* — Mary C Jacob
*Assistant Examiner* — Scott S Cook

(57) ABSTRACT

Methods of producing an electronic geometric model, and systems which perform the methods are disclosed. In some embodiments, the method includes accessing electronic data, the data including polygonal data defining a reference object and a mesh of polygonal data points, the mesh including a plurality of edges. Such methods also include selecting an edge of the mesh, and in response to an indication from a user determining locations for additional data points, where the locations are adjacent to the selected edge and contact portions of the reference object. Such methods also include inserting the additional data points into the accessed data at the determined locations, and subdividing the accessed data having the additional data points with a subdivision algorithm, whereby subdivided data is generated. Such methods also include generating the geometric model based on the subdivided data, and storing the geometric model in a computer readable data storage.

15 Claims, 41 Drawing Sheets

(56) References Cited

U.S. PATENT DOCUMENTS

2007/0229498 A1* 10/2007 Matusik et al. ............... 345/420
2009/0102833 A1* 4/2009 Boier-Martin et al. ....... 345/419

OTHER PUBLICATIONS

Reif, U., A unified approach to subdivision algorithms near extraordinary vertices, Computer Aided Geometric Design, vol. 12, Issue 2, Mar. 1995, pp. 153-174.*

Zorin, D., "Subdivision Zoo." Subdivision for modeling and animation (1999): 65-104.*

Derose, T., Kass, M., Truong, T., Subdivision Surfaces in character Animation, 1998, [downloaded Feb. 12, 2014] downloaded from the internet https://www.google.com/#q=derose+kass+subdivision+surfaces.*

Xu, Z., Fillet Operations With Recursive Subdivision Surfaces, Geometric Modelling, Springer Science+Business Media New York, 2001.*

Stam, J., Exact Evaluation of Catmull-Clark Subdivision Surfaces at Arbitrary Values, Proceedings SIGGRAPH 1998, $25^{th}$ annual conference on Computer Graphics and Interactive Techniques pp. 395-404.*

Patney, A., Parallel View-Dependent Tessellation of Catmull-Clark Subdivision Surfaces, AMC, 2009, High Performance Graphics, Aug. 2009.*

Rhino 4 Tutorial: Fillet and Champher—Rhino 4 Tutorial http://www.youtube/watch?v=PS1ZdfVL43A.*

Terek, Z., Setback Vertex Blends in Digital Shape Reconstruction, E.R. Hancock et al. (eds.): Mathematics of Surfaces 2009, LNCS 5654, pp. 356-374, 2009. Springer-Verlang Berlin Heidelberg 2009.*

\* cited by examiner

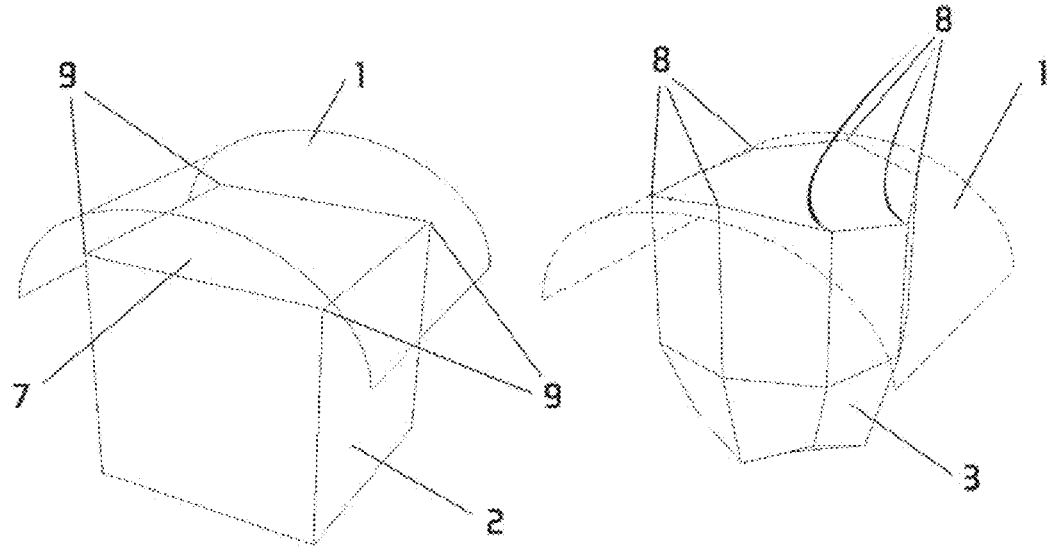
Figure 1A
Figure 1C
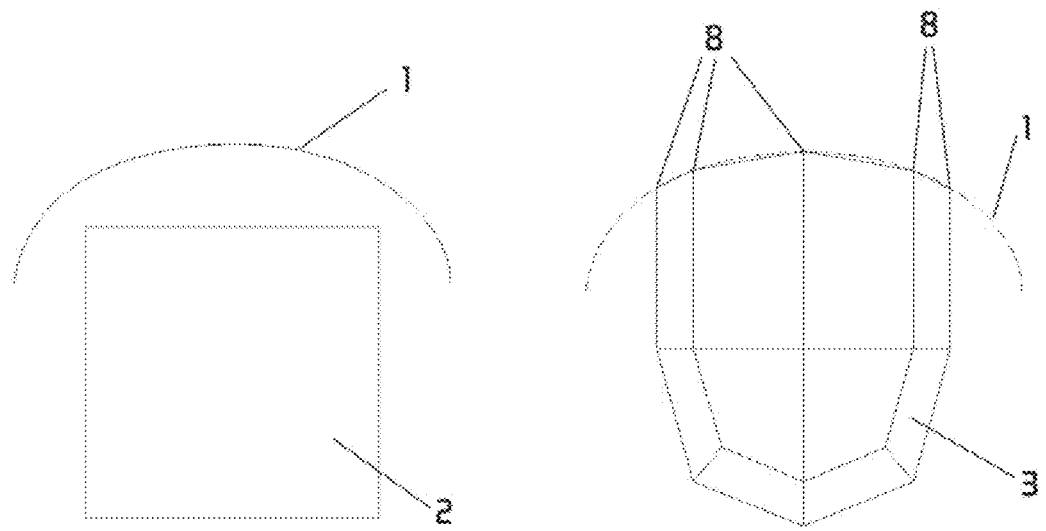
Figure 1B
Figure 1D

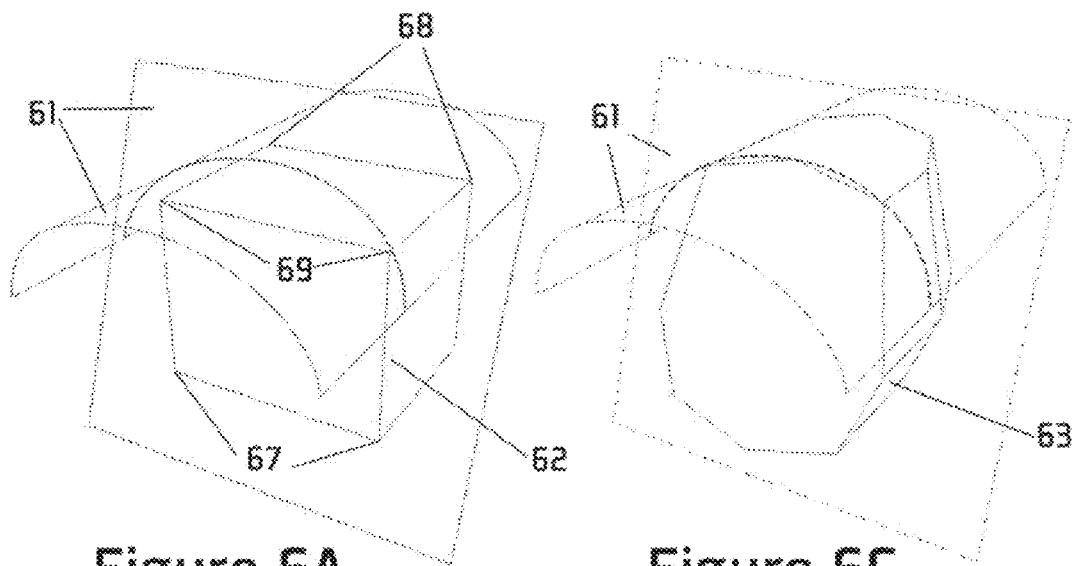
Figure 6A
Figure 6C
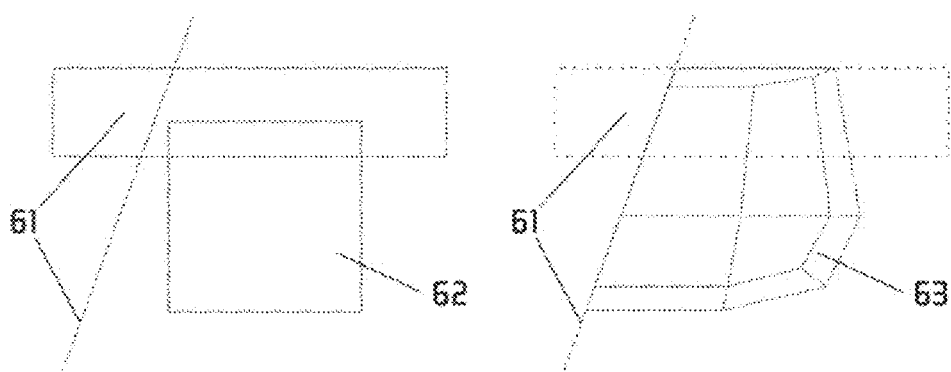
Figure 6B
Figure 6D

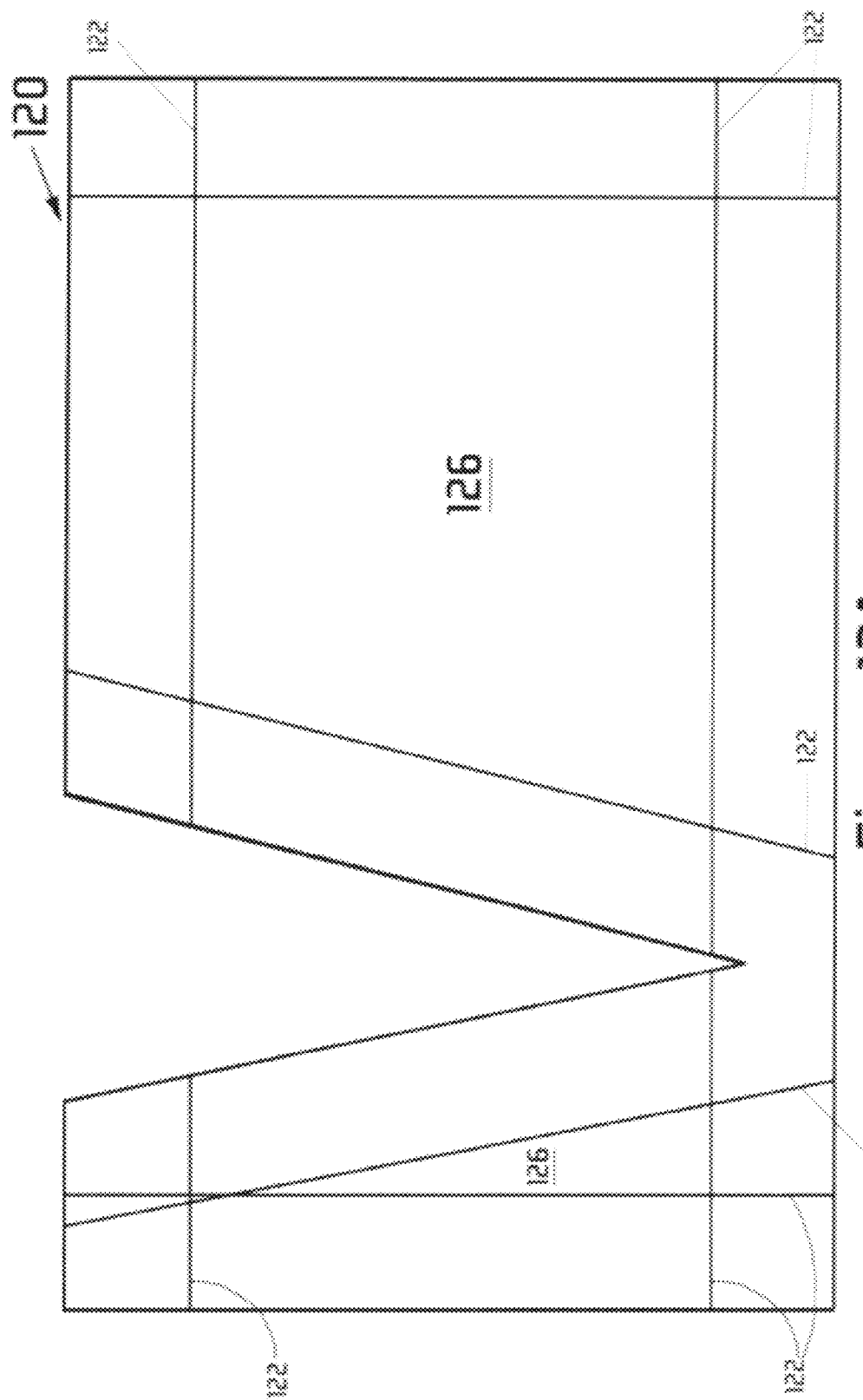

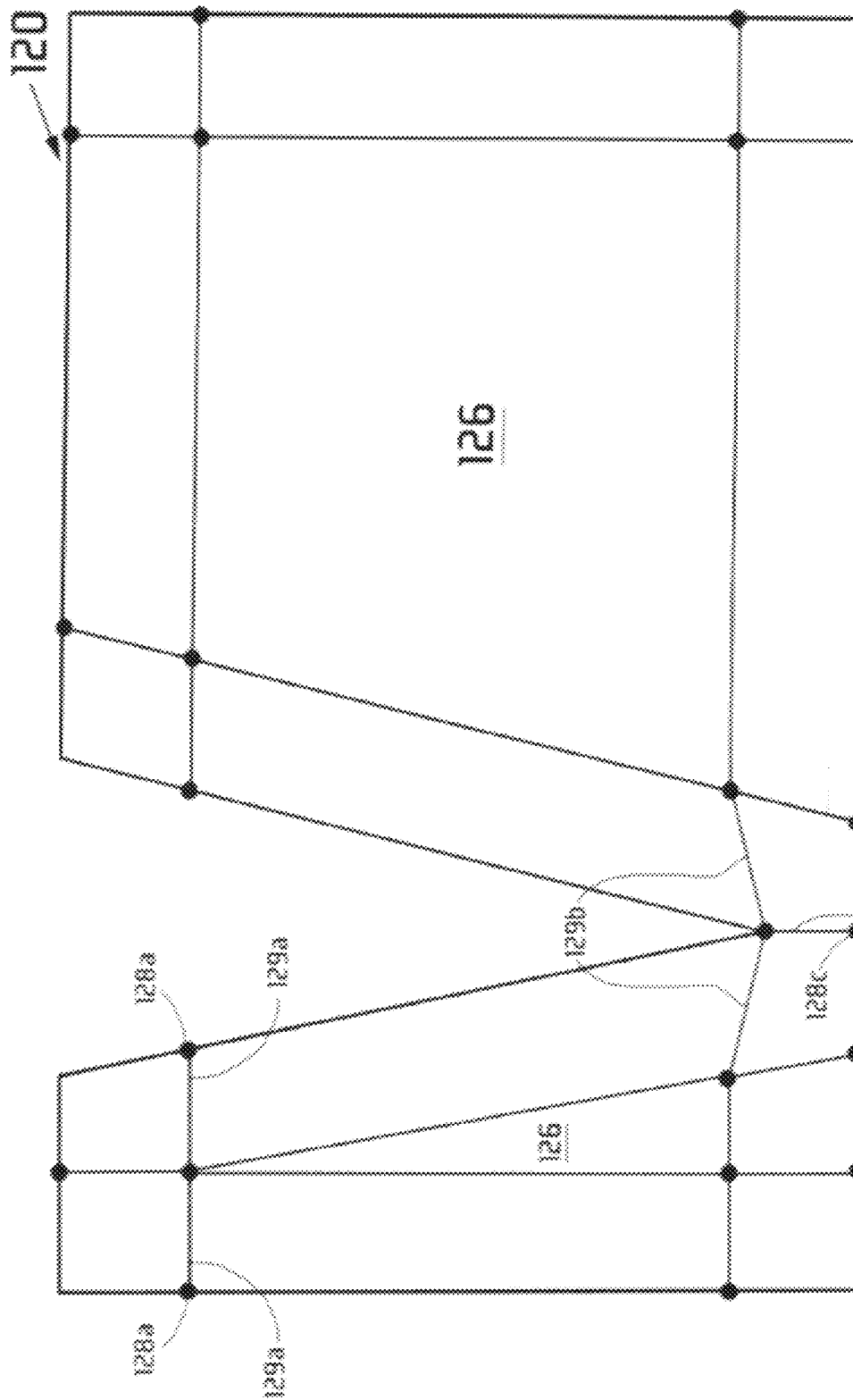

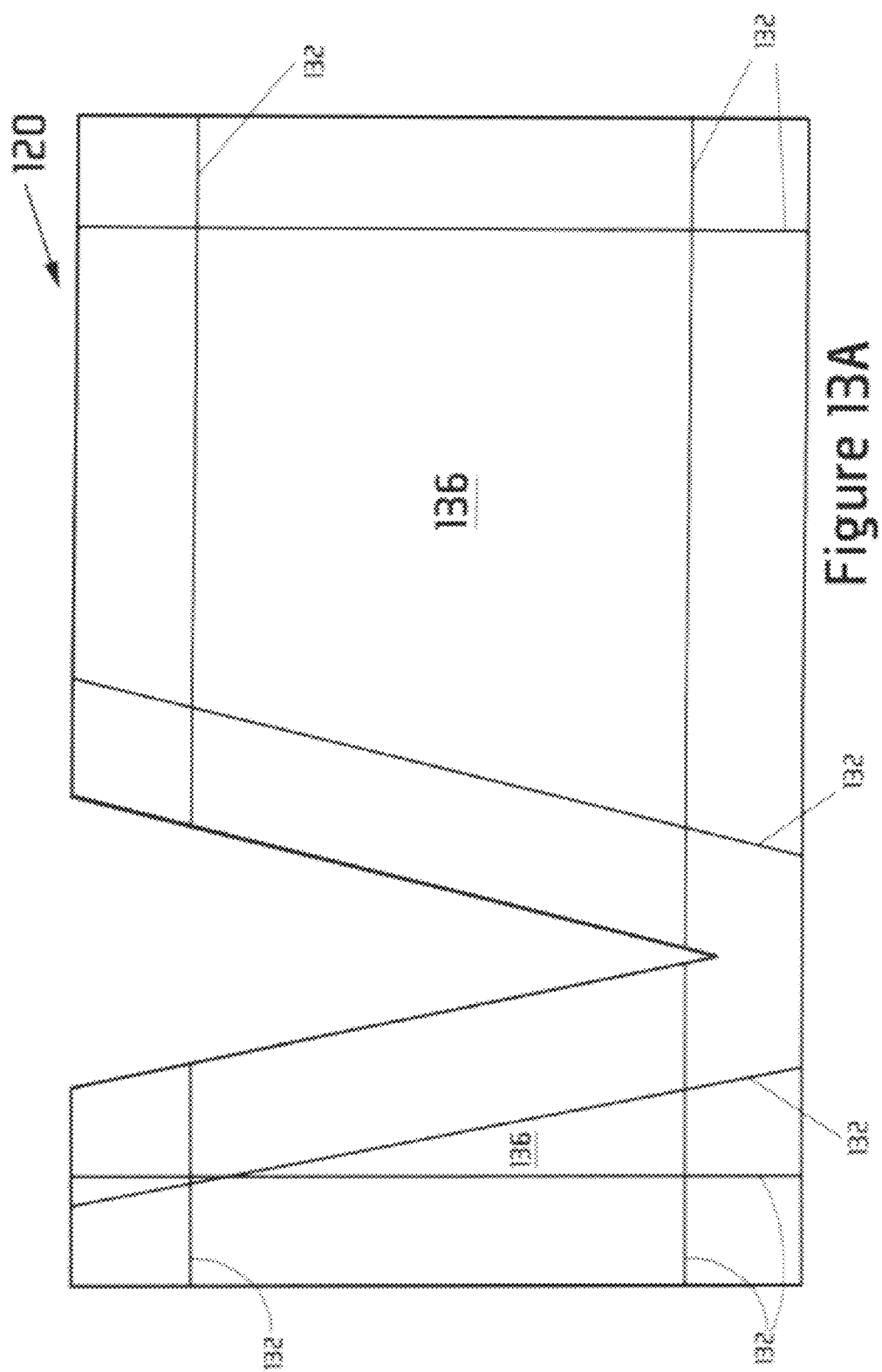

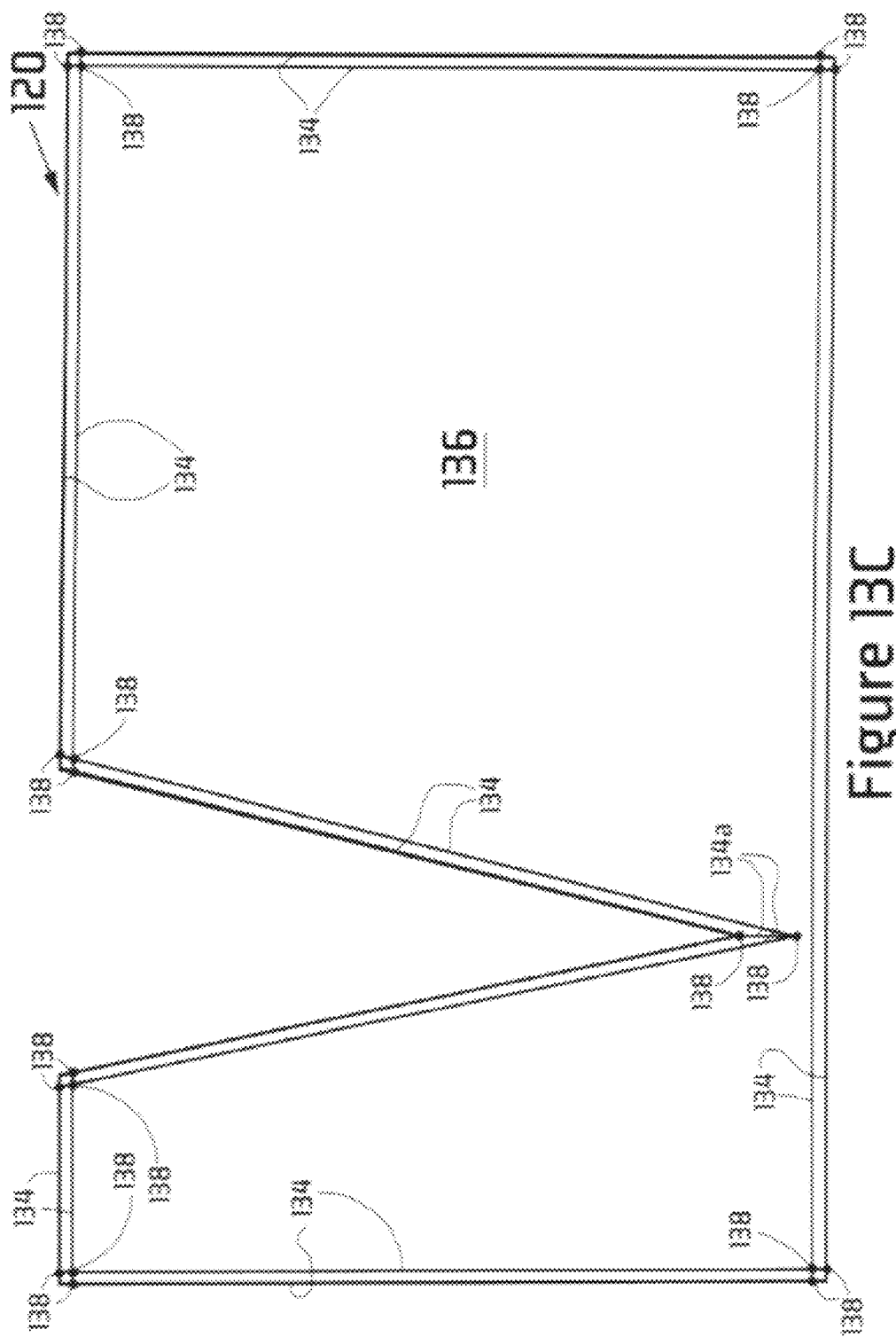

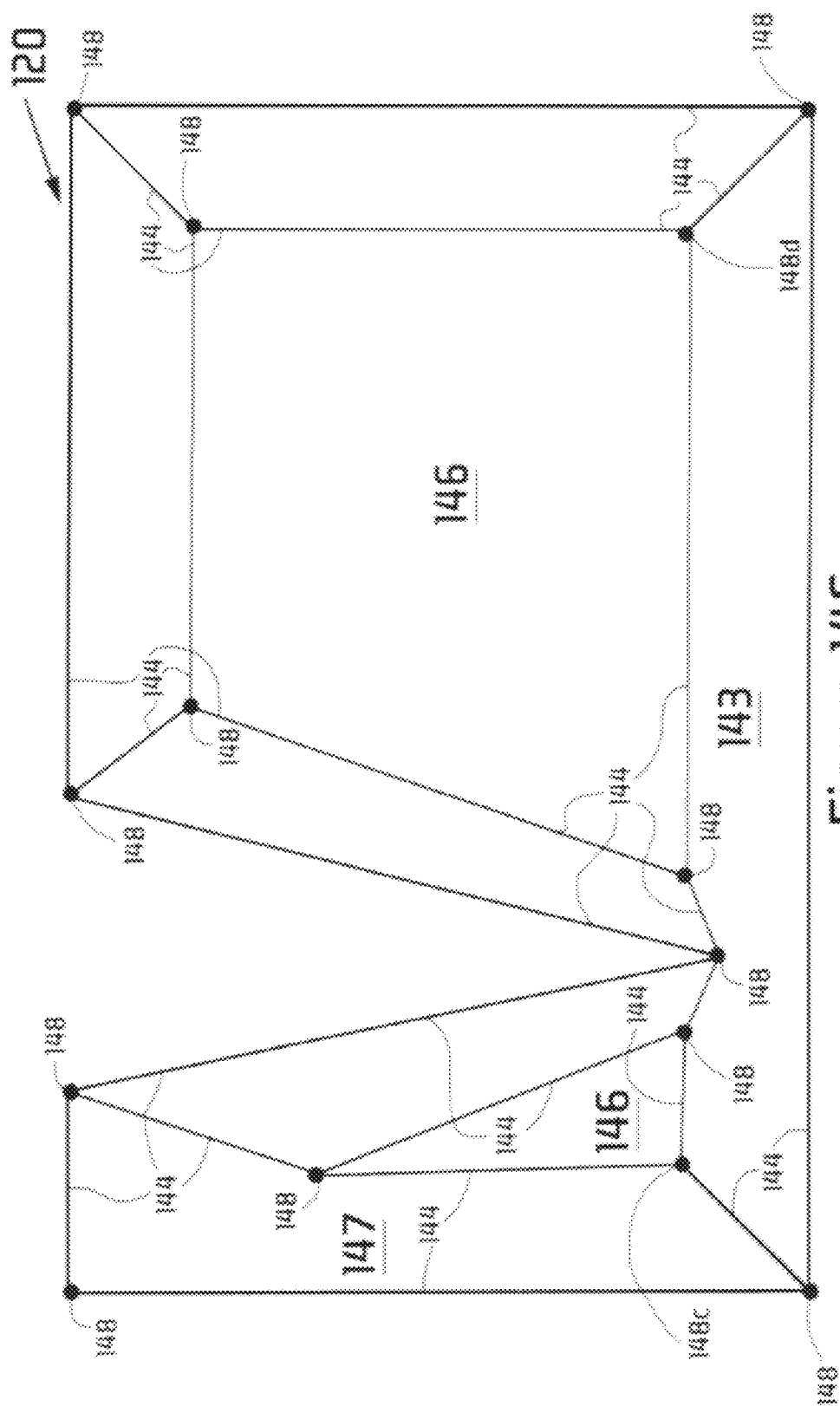

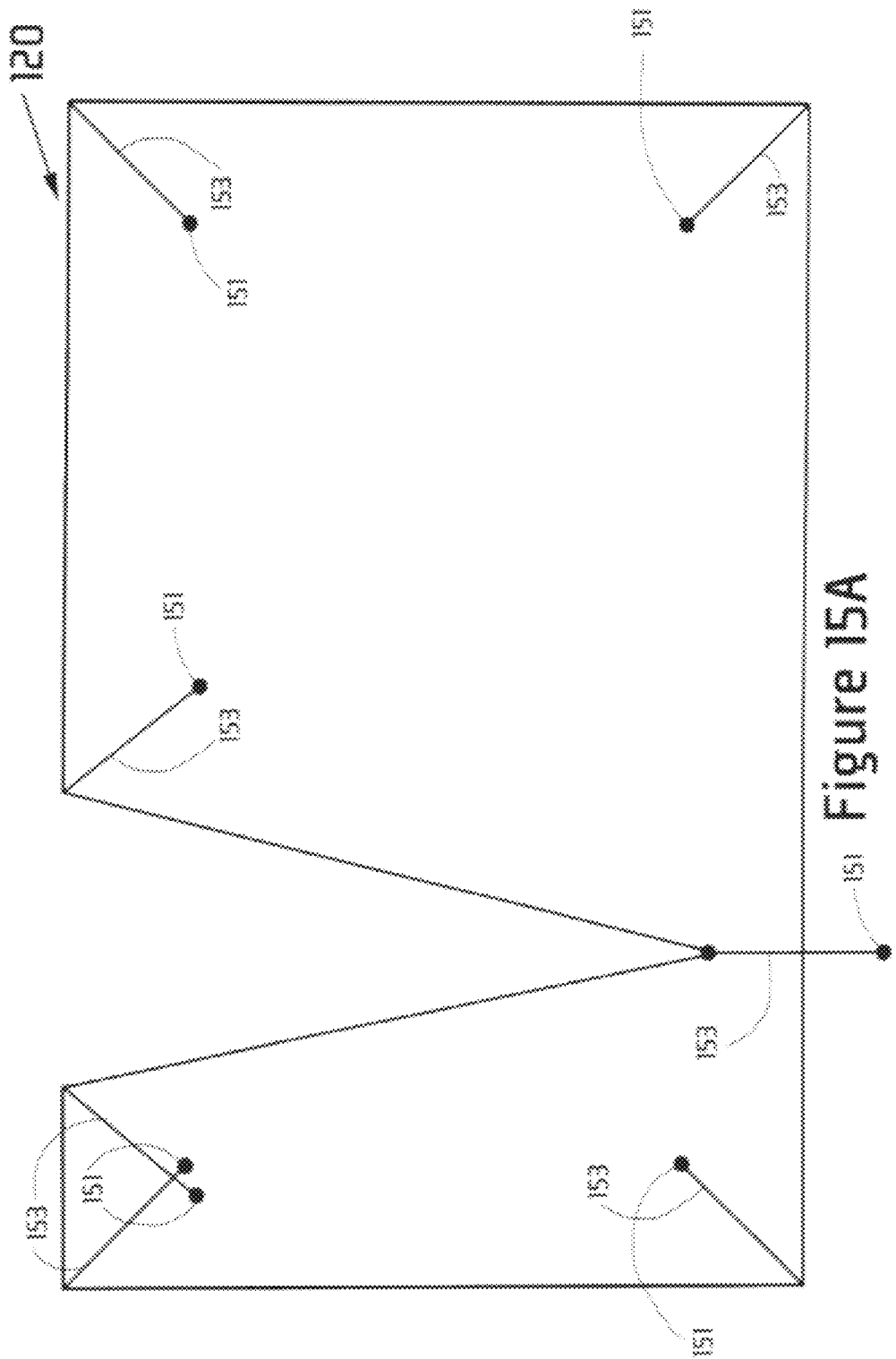

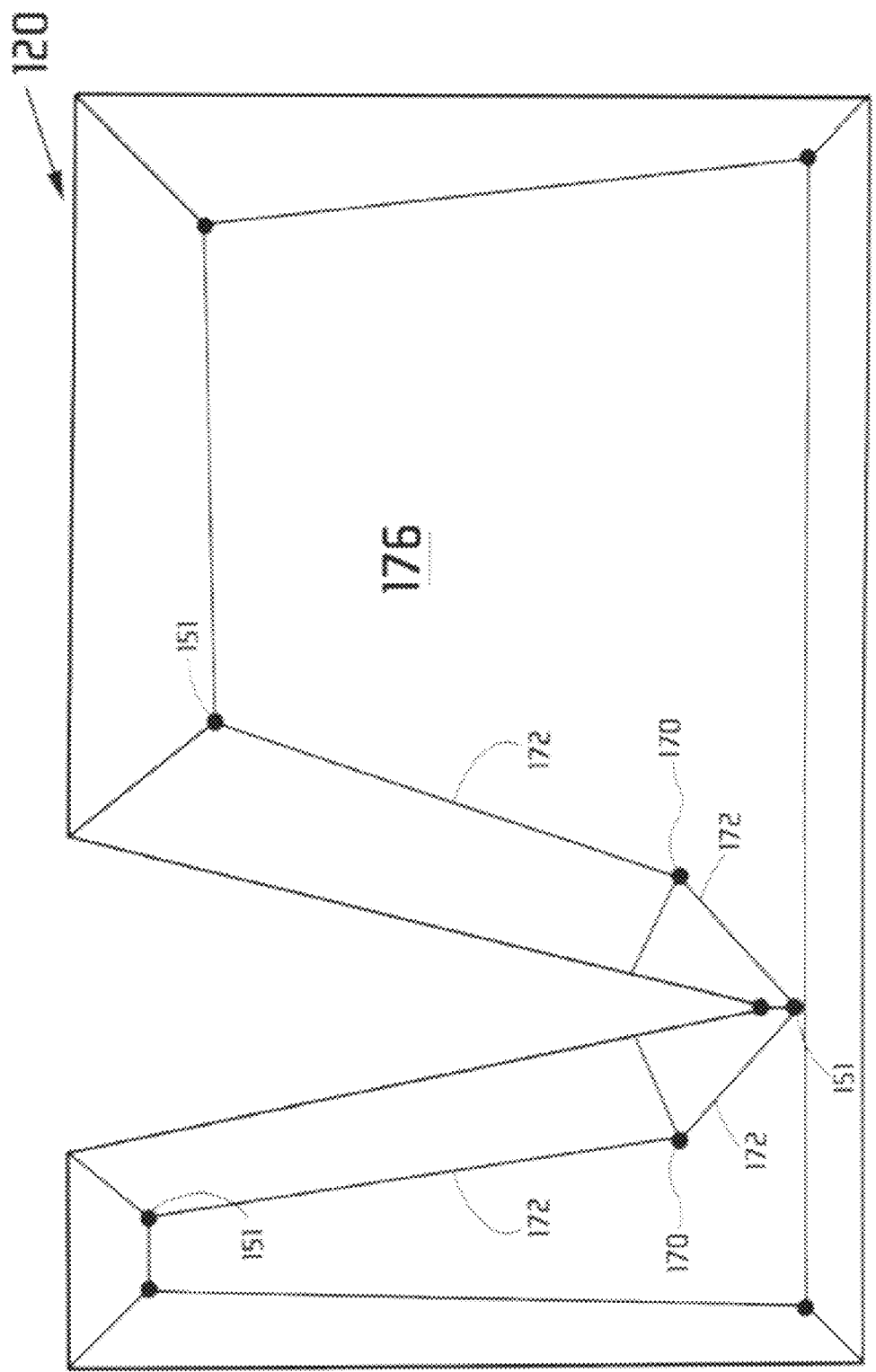

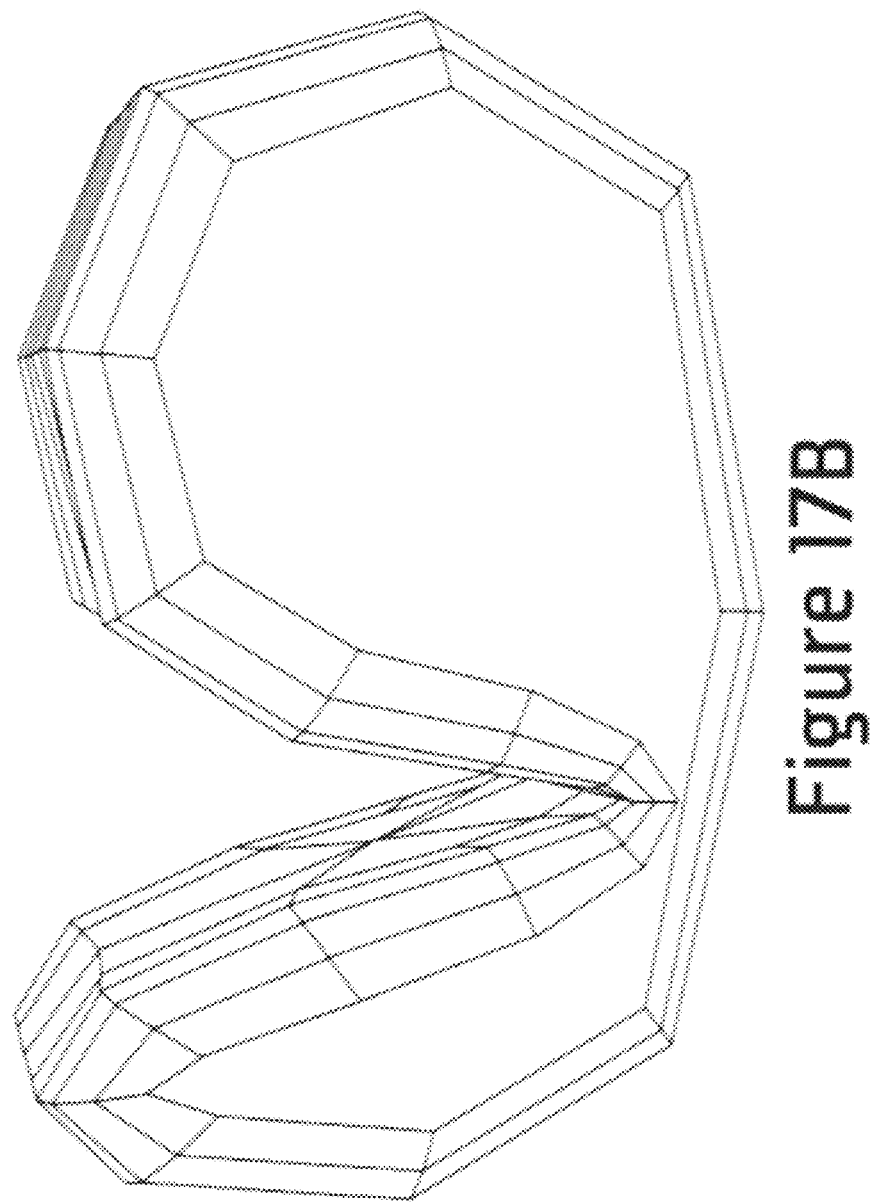

METHOD FOR FILLETING 3D MESH EDGES BY SUBIVISION

BACKGROUND

1. Field

The described technology relates to systems and methods of generating geometric models based on a geometric object and a reference geometry.

2. Description of the Related Technology

Polygonal model data is created with, for example, a 3-D CAD software tool by, for example, a designer. The polygonal model or polygonal mesh includes discrete data points describing one or more surfaces or objects. Polygonal models are convenient for design work at least because they define the surface or object with a degree of detail convenient for the designer to work with. The shape of the surface or object is defined by the data points, and the surface between the data points is perceived, but is not necessarily represented in the data. This allows for the CAD system to function quicker because of a significantly reduced data set representing the surface or object, while providing the designer enough detail to manipulate to achieve a desired design.

The polygonal data may be edited by a designer according to the designer's purposes. For example, the designer may add features to the object represented by the polygonal data using mesh operations. In addition, to create smooth, natural looking objects, a smoothing algorithm may be used to modify the polygonal data. For example, a Catmull-Clark algorithm or a loop subdivision algorithm may be performed on the polygonal data. The smoothing algorithm modifies the polygonal data by, for example, adding vertices and repositioning existing vertices. Thus, the smoothing algorithm generates a modified object.

In some applications, the finished polygonal data object may preferably have a Portion thereof having geometric parameters specified by an external predetermined reference object. For example, a polygonal data object, which represents a part of a machine, may be generated. The finished machine part may have a surface which is to mate against another surface or part of the machine. Accordingly, in the process of generating the polygonal data object, a reference object having the characteristics of the other surface or part of the machine may be used to generate the surface of the polygonal data object which will mate to the surface of the machine.

Conventionally, to generate such an object, the Catmull-Clark or loop subdivision algorithm is performed on the polygonal data to generate a smooth machine part. Subsequently, the smooth machine part is manually edited by a designer who moves vertices of the smooth machine part to generate the desired surface which conforms to the other machine surface. Such a manual process is time consuming and error prone.

SUMMARY OF CERTAIN INVENTIVE ASPECTS

Various aspects of certain embodiments of methods and systems for generating smoothed polygonal data having a desired predetermined geometric characteristic are discussed. The methods and systems receive polygonal data which describe discrete points on an object and receive a reference object which describes the desired geometric characteristics of the smoothed polygonal data. The methods and systems smooth the polygonal data and shape the smoothed polygonal data according to the reference object.

BRIEF DESCRIPTION OF THE DRAWINGS

FIGS. 1A-1H are graphical illustrations of a reference geometry and polygonal data at different points during an embodiment of a method of generating smoothed polygonal data.

FIGS. 6A-6H are graphical illustrations of multiple reference geometrics and polygonal data at different points during an embodiment of a method of generating smoothed polygonal data.

FIGS. 12A-12D are illustrations of polygonal data at various stages in an embodiment of a method of smoothing.

FIGS. 13A-13D are illustrations of polygonal data at various stages in another embodiment of a method of smoothing.

FIGS. 14A-14F are illustrations of polygonal data at various stages in yet another embodiment of a method of smoothing.

FIGS. 15A-15D are illustrations of polygonal data at various stages in another embodiment of a method of smoothing.

FIGS. 17A-17B are illustrations of polygonal data at various stages in another embodiment of a method of smoothing.

DETAILED DESCRIPTION OF CERTAIN INVENTIVE EMBODIMENTS

Figure 1E:
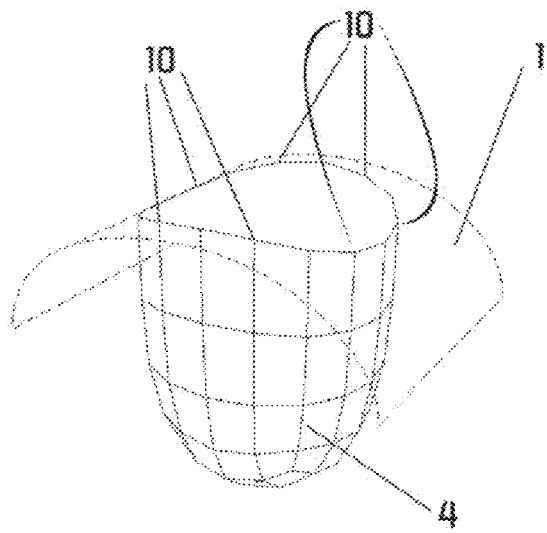

Various aspects and features of methods and systems are described herein with reference to the accompanying drawings, which show certain exemplary embodiments. The described embodiments may be modified in various ways, without departing from the spirit or scope of the present invention or inventions. In addition, the described embodiments have multiple features and aspects, no single one of which is solely responsible for the desirable characteristics of the embodiments. Furthermore, no single feature or aspect is essential to practicing the methods and systems described herein. Furthermore, various features and aspects of the embodiments may be combined in embodiments not specifically described.

Various inventive aspects of certain embodiments of methods and systems for generating smoothed polygonal data objects having a portion with desired geometric characteristics are discussed. The methods and systems access one or more reference geometrics which describe the desired geometric characteristic of the smoothed object and access polygonal data which describe discrete points of a geometric object. The methods and systems use a smoothing algorithm, such as a Catmull-Clark or loop subdivision algorithm to smooth the geometric object and use the reference geometry to cause the smoothed polygonal object to have a portion with the desired geometric characteristics.

For example, the methods and systems may access electronic data which describes reference object 1 and polygonal data object 2, such as the represented in FIGS. 1A and 1B. In this example the reference object 1 is a surface model. In some embodiments, the reference object is a polygonal model or another type of model. Based on the accessed data, and according to input from a user, the methods and computer systems generate a smoothed polygonal object 5, such as that represented in FIGS. 1G and 1H. Among other beneficial aspects, the smoothed polygonal object 5 has been smoothed according to the smoothing algorithm and represents a surface 6 which has geometric characteristics which are defined by the reference geometry 1. In this example, the surface 6 conforms to the reference geometry 1.

FIGS. 1A-1H are graphical illustrations of the reference geometry 1 and polygonal data 2, 3, 4, and 5 at different points during an embodiment of a method of generating the smoothed polygonal object 5. FIGS. 1A and 1B represent reference object 1 and polygonal data object 2 as accessed and prior to smoothing and conforming.

In some embodiments, prior to the smoothing and conforming operation, using the computer system, a user arranges and orients the polygonal data object 2 and the reference object 1 so as to have a desired spatial relationship. The user also provides an indication to the computer system designating a portion of the polygonal data object 2 as that which is to conform to the reference object 1 during subsequent smoothing and conforming operations. In addition, the user provides an indication as to how the designated portion is to conform to the reference object 1. Various conforming schemes are discussed below. The computer system then records with the data representing the polygonal data object 2, information indicating the designation. For example, the user may indicate that a surface generated based on the top surface 7 of polygonal data object 2 is to conform to the reference object 1. In response to the indication, the computer system may record information for, or "mark", the top surface 7 which indicates that the surface generated based on surface 7 is to conform to the reference object 1. Similarly, the user may indicate that vertices based on one or more of the vertices 9 defining the top surface 7 are to conform to the reference object 1. In response to the indication, the computer system may record information for, or mark, each of the vertices 9 which indicates that each of the vertices generated based on the vertices 9 is to conform to the reference object 1. Accordingly, the information stored for the marked at least one surface and/or marked one or more vertices can be used as a flag or marker to indicate to the smoothing and conforming algorithm that new geometrics created during a smoothing operation based on the marked geometrics are to be located according to the reference object 1. In some embodiments, the new geometrics created by the smoothing operation inherit the markers from the geometrics from which they are created.

FIGS. 1C and 1D show polygonal object 3 after one iteration of smoothing and conforming. As indicated in FIGS. 1C and 1D, the smoothing and conforming has added vertices and located vertices such that polygonal object 3 is smoother and rounder as compared to polygonal data object 2 on which the smoothing and conforming operations were performed. In addition, the smoothing and conforming operations have generated the object 3 having vertices 8, which are on the reference geometry 1.

In some embodiments, a position is determined by a smoothing algorithm for each vertex 8 without regard for the reference geometry 1. Subsequently, each vertex 8 is projected from the position determined by the smoothing algorithm to the reference geometry 1 according to a projection scheme indicated by the user. In this embodiment, the direction for the projection paths is perpendicular to the top surface 7, which is adjacent to the reference geometry 1. Accordingly, the vertices 8 are moved from their positions as determined by the smoothing algorithm to the reference geometry 1 along parallel projection paths. In some embodiments, projection paths are determined using other methods, such as those described below.

In some embodiments, prior to performing the smoothing and conforming algorithm, the computer system moves the marked geometrics of the object 2 to the reference geometry 1 along a projection path, for example, such as that described above. In such embodiments, the vertices moved after the smoothing operation are marked new vertices added by the smoothing algorithm.

Other methods of determining projection paths and locations for the moved vertices may be used. For example, using the smoothing and conforming algorithm, the computer system may generate new vertices based on vertices of the polygonal data object 2 which are on the reference geometry 1 such that locations for the new vertices are on the reference geometry 1, and are calculated using a space confined to the reference geometry 1. In such embodiments a smoothing algorithm does not determine a position for each new vertex which is subsequently modified according to a projection path, but instead, the computer system calculates the position for each new vertex directly from the positions of the previously generated vertices and the space defined by and limited to the reference geometry 1.

Figure 1G:
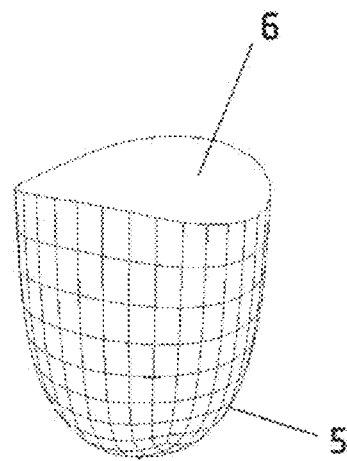
Figure 1F:
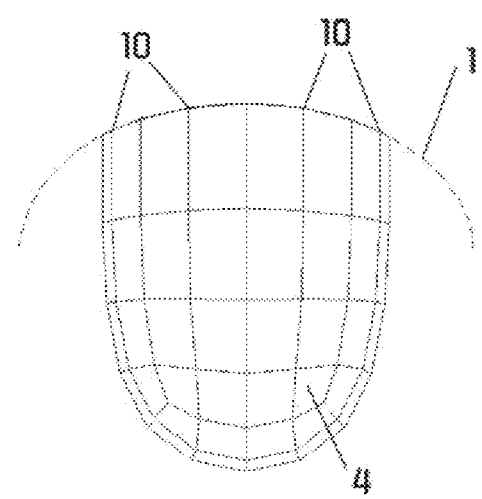

FIGS. 1E and 1F show polygonal object 4 after a second iteration of smoothing and conforming. As indicated in FIGS. 1E and 1F, the second iteration of smoothing and conforming has added and moved vertices such that polygonal object 4 is smoother and rounder as compared to polygonal object 3 on which the smoothing and conforming operations were performed. In addition, the smoothing and conforming operations have generated vertices 10 of the object 4 which are on the reference geometry 1. In this embodiment, the projection paths of the moved vertices 10 are parallel to the projection paths of the moved vertices 8 discussed above with reference to FIGS. 1C and 1D. In some embodiments, projection paths of a second iteration of smoothing and conforming may not be parallel to the projection paths of a first iteration of smoothing and conforming. For example, prior to each iteration, the user may provide an indication for the computer system to use another projection path scheme.

Figure 1H:
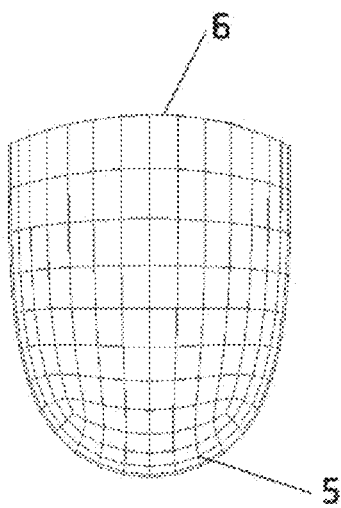

FIGS. 1G and 1H show polygonal object 5 after a third iteration of smoothing and conforming. In FIGS. 1G and 1H the reference geometry 1 is not shown. As indicated in FIGS.

1G and 1H, the third iteration of smoothing and conforming has added vertices such that polygonal object 5 is smoother and rounder as compared to polygonal object 4 on which the smoothing and conforming operations were performed. In addition, the smoothing and conforming operations have generated vertices which conform to the reference geometry 1. In this embodiment, the projection paths of the moved vertices are parallel to the projection paths of the moved vertices 8 and 10 discussed above with reference to FIGS. 1C and 1D and FIGS. 1E and 1F. As indicated in FIGS. 1G and 1H, the polygonal object 5 is much smoother than the original polygonal object 2 and defines a surface 6 which conforms to the reference geometry 1.

FIGS. 2A-2H are graphical illustrations of the reference geometry 21 and polygonal data 22, 23, 24, and 25 at different points during an embodiment of a method of generating the smoothed polygonal object 25. In this embodiment, smoothing and conforming operations are performed which are similar to the smoothing and conforming operations discussed above with regard to FIGS. 1A-1H. In this embodiment, the projection paths of new vertices which conform to reference geometry 21 are not parallel to one another. Instead, in this embodiment, the projection paths are perpendicular to the reference geometry 21.

Figure 2A:
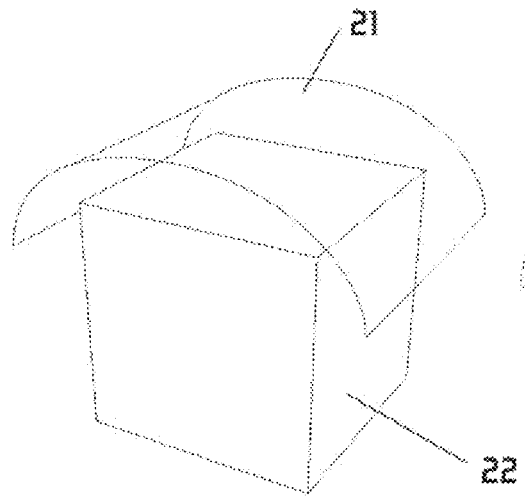
FIGS. 2A-2H are graphical illustrations of a reference geometry and polygonal data at different points during another embodiment of a method of generating smoothed polygonal data.
Figure 2C:
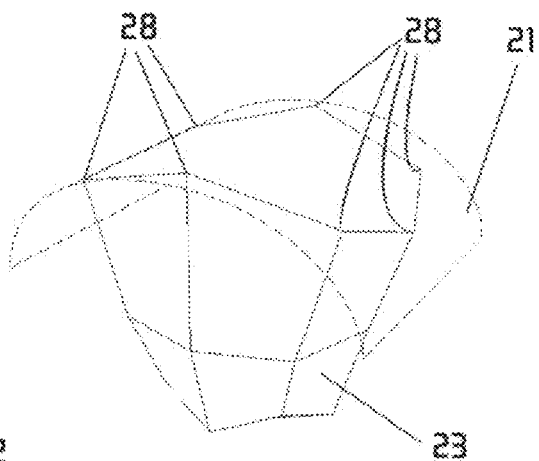
Figure 2B:
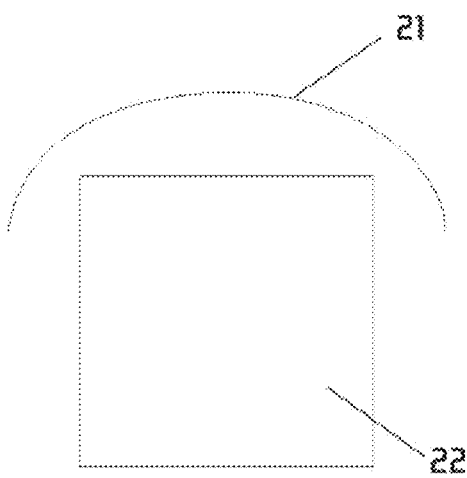

FIGS. 2A and 2B represent reference object 21 and polygonal data object 22 as accessed by the computer system and prior to smoothing and conforming. In some embodiments, prior to the smoothing and conforming operation, using the computer system, a user arranges and orients the polygonal data object 22 and the reference object 21 so as to have a desired spatial relationship. The user also provides an indication to the computer system to mark a portion of the polygonal data object 22 as that which is to conform to the reference object 21 during one or more subsequent smoothing and conforming operations. In addition, the user provides an indication as to how the designated portion is to conform to the reference object 21, such as what projection scheme is to be used.

Figure 2D:
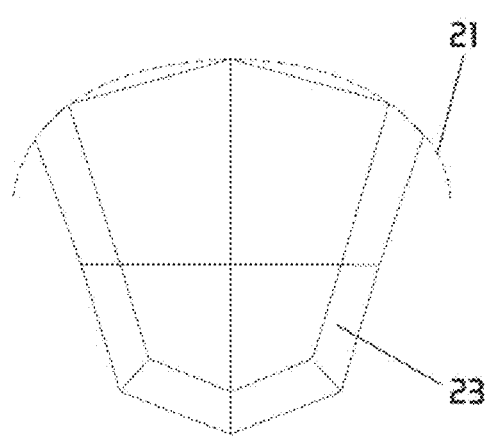

FIGS. 2C and 2D show polygonal object 23 after one iteration of smoothing and conforming. As indicated in FIGS. 2C and 2D, the smoothing and conforming has added vertices and located vertices such that polygonal object 23 is smoother and rounder as compared to polygonal data object 22 on which the smoothing and conforming operations were performed. In addition, the smoothing and conforming operations have generated the object 23 having vertices 28, which are on the reference geometry 21.

In some embodiments, a position is determined by a smoothing algorithm for each vertex 28 without regard for the reference geometry 21. Subsequently, each vertex 28 is projected from the position determined by the smoothing algorithm to the reference geometry 21 according to a projection scheme indicated by the user. In this embodiment, the direction for each of the projection paths is perpendicular to the reference geometry 21. Accordingly, the vertices 28 are moved from their positions determined by the smoothing algorithm to the reference geometry 21 along projection paths which are normal to the reference geometry 21 and intersect the positions determined by the smoothing algorithm and prior to projection.

In some embodiments, prior to performing the smoothing and conforming operation, the computer system moves the marked geometrics of the object 22 to the reference geometry 21 along a projection path, for example, such as that described above. In such embodiments, the vertices moved after the smoothing operation are marked new vertices added by the smoothing algorithm.

Figure 2E:
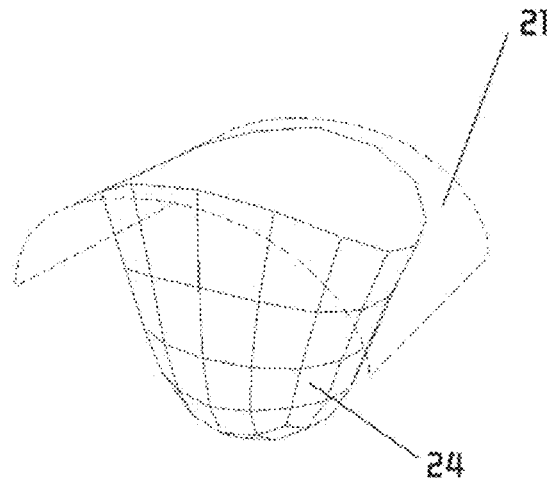
Figure 2G:
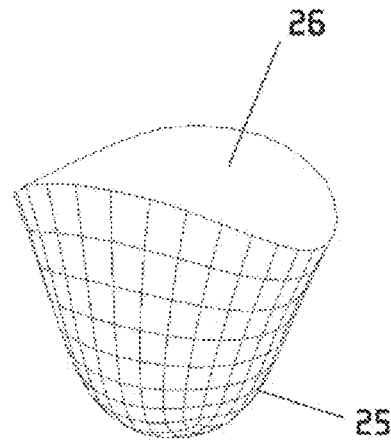
Figure 2F:
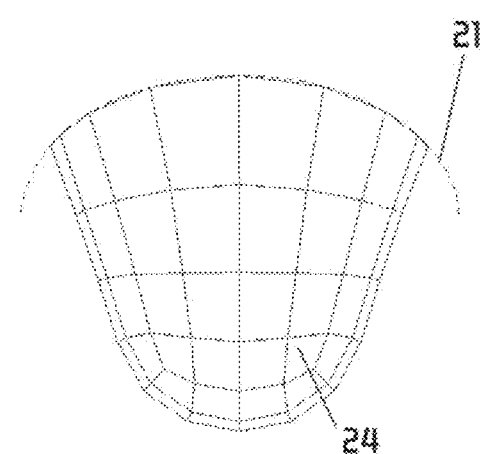

FIGS. 2E and 2F show polygonal object 24 after a second iteration of smoothing and conforming. As indicated in FIGS. 2E and 2F, the second iteration of smoothing and conforming has added and moved vertices such that polygonal object 24 is smoother and rounder as compared to polygonal object 23 on which the smoothing and conforming operations were performed. In addition, the smoothing and conforming operations have generated vertices of the object 24 which are on the reference geometry 21. In this embodiment, the projection paths of the moved vertices are perpendicular to the reference object 21. In some embodiments, projection paths of a second iteration of smoothing and conforming may not be determined according to the same scheme as the projection paths of a first iteration of smoothing and conforming. For example, prior to each iteration, the user may provide an indication for the computer system to use another projection path scheme.

Figure 2H:
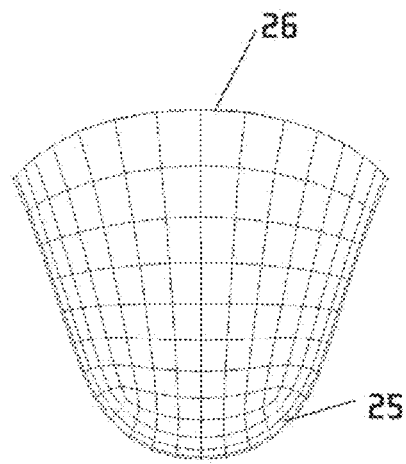

FIGS. 2G and 2H show polygonal object 25 after a third iteration of smoothing and conforming. In FIGS. 2G and 2H the reference geometry 21 is not shown. As indicated in FIGS. 2G and 2H, the third iteration of smoothing and conforming has added vertices such that polygonal object 25 is smoother and rounder as compared to polygonal object 24 on which the smoothing and conforming operations were performed. In addition, the smoothing and conforming operations have generated vertices which conform to the reference geometry 21. In this embodiment, the projection paths of the moved vertices are determined according to the same scheme as the projection paths of the moved vertices discussed above with reference to FIGS. 2C and 2D and FIGS. 2E and 2F. As indicated in FIGS. 2G and 2H, the polygonal object 25 is much smoother than the original polygonal object 22 and defines a surface 26 which conforms to the reference geometry 21.

FIGS. 3A-3L are graphical illustrations of a reference geometry 31 and polygonal data 32, 33, 34, and 35 at different points during an embodiment of a method of generating smoothed polygonal data 35. In this embodiment, smoothing and conforming operations are performed which are similar to the smoothing and conforming operations discussed above with regard to FIGS. 1A-1H and 2A-2H. In this embodiment, the reference object or geometry 31 is a curve and the projection paths of new vertices which conform to reference geometry 31 are perpendicular to the reference geometry 31.

Figure 3A:
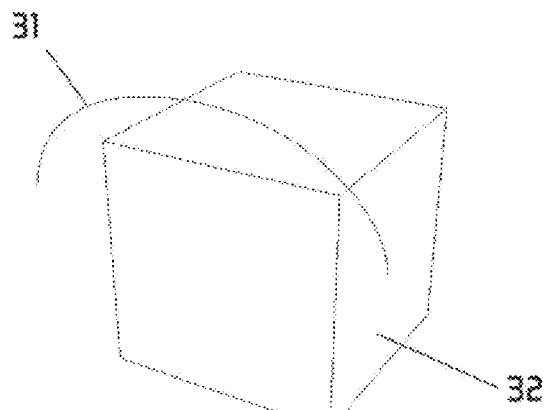
FIGS. 3A-3L are graphical illustrations of a reference geometry and polygonal data at different points during yet another embodiment of a method of generating smoothed polygonal data.
Figure 3D:
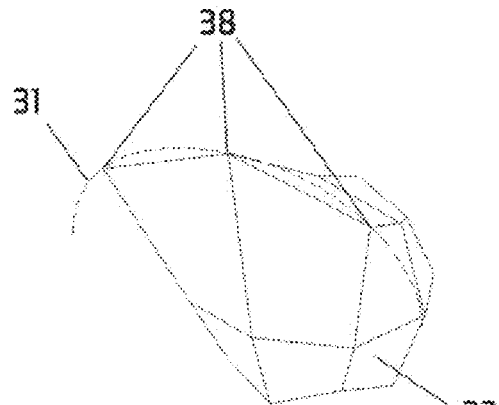
Figure 3B:
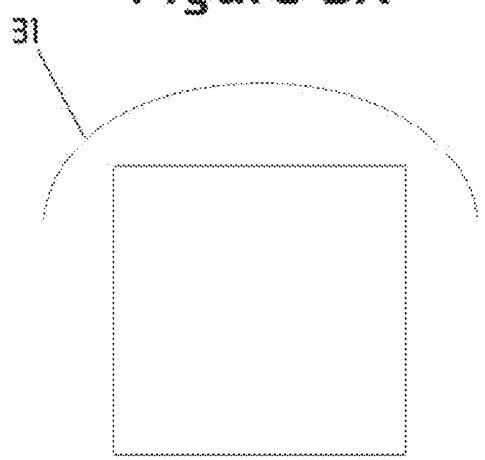
Figure 3E:
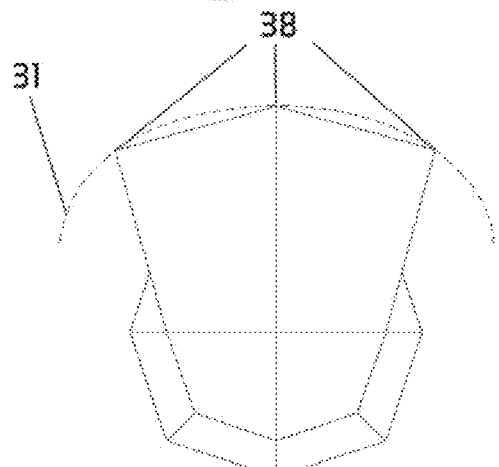
Figure 3C:
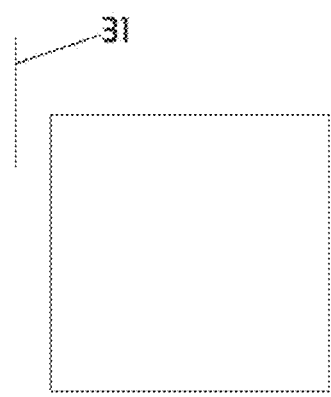

FIGS. 3A, 3B, and 3C represent reference object 31 and polygonal data object 32 as accessed by the computer system and prior to smoothing and conforming. In some embodiments, prior to the smoothing and conforming operation, using the computer system, a user arranges and orients the polygonal data object 32 and the reference object 31 so as to have a desired spatial relationship. The user also provides an indication to the computer system to mark a portion of the polygonal data object 32 as that which is to conform to the reference object 31 during subsequent smoothing and conforming operations. In addition, the user provides an indication as to how the designated portion is to conform to the reference object 31, such as what projection scheme is to be used.

Figure 3F:
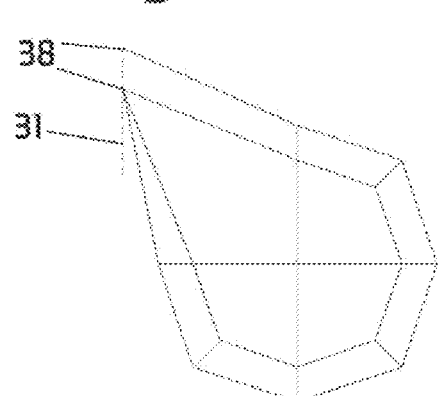

FIGS. 3D, 3E, and 3F show polygonal object 33 after one iteration of smoothing and conforming. As shown, the smoothing and conforming has added vertices and located vertices such that polygonal object 33 is smoother and rounder as compared to polygonal data object 32 on which the smoothing and conforming operations were performed. In addition, the smoothing and conforming operations have generated the object 33 having vertices, which are on the reference geometry 31.

In some embodiments, a position is determined by a smoothing algorithm for each vertex without regard for the reference geometry 31. Subsequently, each marked vertex is projected from the position determined by the smoothing algorithm to the reference geometry 31 according to a projection scheme indicated by the user. In this embodiment, the direction for each of the projection paths is perpendicular to the reference geometry curve 31. Accordingly, the vertices 38 are moved from the positions determined by the smoothing algorithm to the reference geometry 31 along projection paths which are normal to the reference geometry 31 and intersect the positions determined by the smoothing algorithm and prior to projection.

Figure 3G:
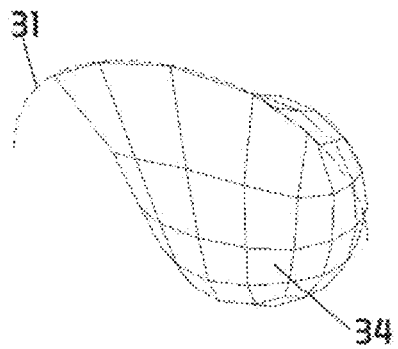
Figure 3J:
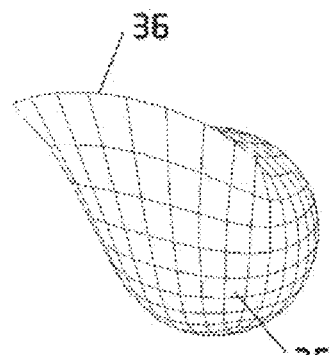
Figure 3H:
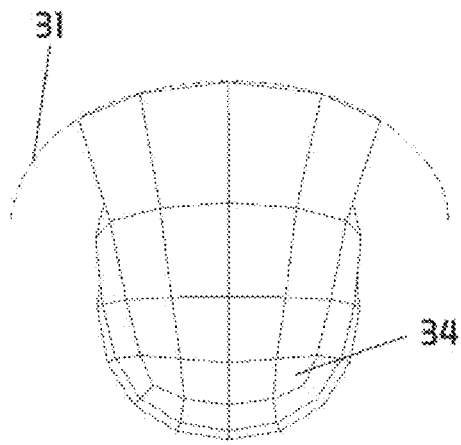
Figure 3K:
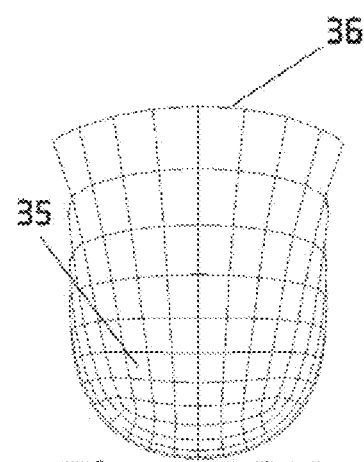
Figure 3I:
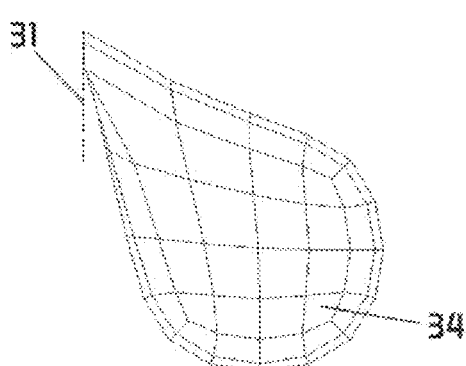

FIGS. 3G, 3H, and 3I show polygonal object 34 after a second iteration of smoothing and conforming. As shown, the second iteration of smoothing and conforming has added and moved vertices such that polygonal object 34 is smoother and rounder as compared to polygonal object 33 on which the smoothing and conforming operations were performed. In addition, the smoothing and conforming operations have generated vertices of the object 34 which are on the reference geometry curve 31. In this embodiment, the projection paths of the moved vertices are perpendicular to the reference object 31.

Figure 3L:
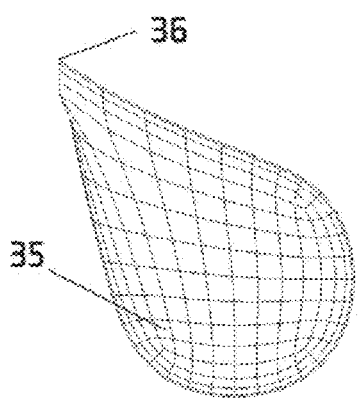

FIGS. 3J, 3K, and 3L show polygonal object 35 after a third iteration of smoothing and conforming. As shown, the third iteration of smoothing and conforming has added vertices such that polygonal object 35 is smoother and rounder as compared to polygonal object 34 on which the smoothing and conforming operations were performed. In addition, the smoothing and conforming operations have generated vertices which conform to the reference geometry 31. In this embodiment, the projection paths of the moved vertices are determined according to the same scheme as the projection paths of the moved vertices discussed above with reference to FIGS. 3D, 3E, and 3F and FIGS. 3G, 3G, and 3L. As shown, the polygonal object 35 is much smoother than the original polygonal object 32 and defines a curve 36 which conforms to the reference geometry curve 31.

FIGS. 4A-4D are graphical illustrations of a reference geometry 41 and polygonal data 42, 43, 44, and 45 at different points during an embodiment of a method of generating smoothed polygonal data 45. In this embodiment, smoothing and conforming operations are performed which are similar to the smoothing and conforming operations discussed above. In this embodiment, the polygonal data defines a surface, the reference object or geometry 41 is a curve and the projection paths of new vertices which conform to reference geometry 41 are perpendicular to the reference geometry 41.

Figure 4A:
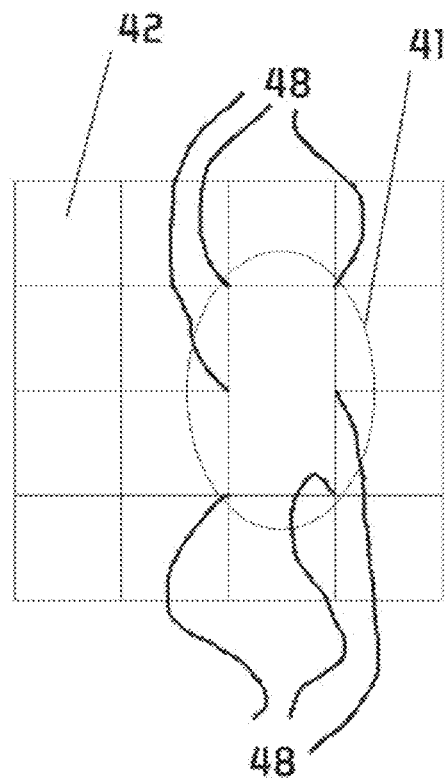
FIGS. 4A-4D are graphical illustrations of a reference geometry and polygonal data at different points during an embodiment of a method of generating smoothed polygonal data.

FIG. 4A represents reference object 41 and polygonal data object 42 as accessed by the computer system and prior to smoothing and conforming. In some embodiments, prior to the smoothing and conforming operation, using the computer system, a user arranges and orients the polygonal data object 42 and the reference object 41 so as to have a desired spatial relationship. The user also provides an indication to the computer system to mark a portion of the polygonal data object 42 as that which is to conform to the reference object 41 during subsequent smoothing and conforming operations. In this embodiment, vertices 48 are marked. In addition, the user provides an indication as to how the designated portion is to conform to the reference object 41, such as what projection scheme is to be used.

Figure 4B:
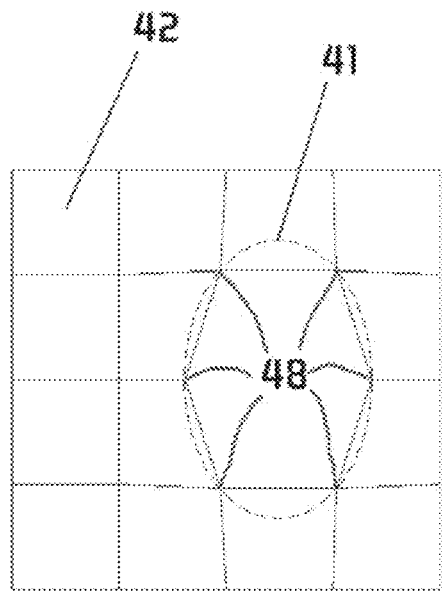

FIG. 4B shows polygonal object 42 prior to a smoothing operation. In response to an indication from the user, the computer system moves the vertices 48 to conform to the reference object 41 according to a projection path. As shown, each of the vertices 48 has been moved so as to be on the reference object 41. The point on the reference object for each of the vertices 48 corresponds to the point as determined by the computer system according to the projection path scheme selected or input by the user. In this embodiment, each of the vertices 48 is moved to a nearest point on the reference object 41.

Other projection path schemes may be used. For example, in some embodiments, the user indicates a location of a central point and the data describing one or more vertices includes the location of the central point. Projection paths for the vertices having the central point are determined to be along a line from the central point through the position of the vertex prior to being moved. In some embodiments, one or more marked vertices have projection path schemes which are different from a projection path scheme of on or more other vertices.

In some embodiments, a position is determined by a smoothing algorithm for each vertex without regard for the reference geometry 41. Subsequently, each marked vertex is projected from the position determined by the smoothing algorithm to the reference geometry 41 according to the projection scheme indicated by the user. In this embodiment, the direction for each of the projection paths is toward the nearest point on the reference geometry 41.

Figure 4C:
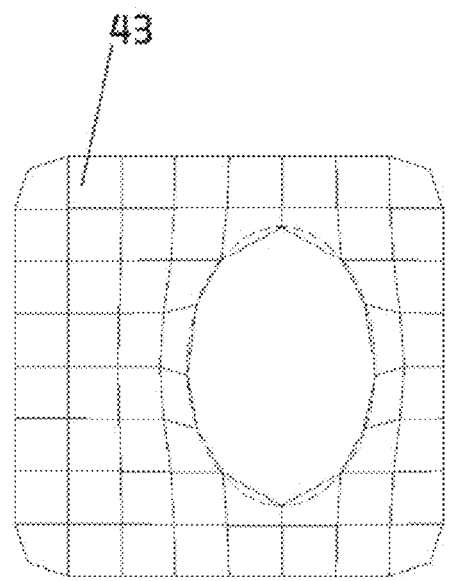

FIG. 4C shows polygonal object 43 after a first iteration of smoothing and conforming. As shown, the first iteration of smoothing and conforming has added and moved vertices such that polygonal object 43 is smoother and rounder as compared to polygonal object 42 on which the smoothing and conforming operations were performed. In addition, the smoothing and conforming operations have generated vertices of the object 43 which are on the reference geometry curve 41. In this embodiment, the projection paths of the marked vertices are along a line from the point determined for each vertex by the smoothing operation toward a nearest point on the reference geometry 41.

Figure 4D:
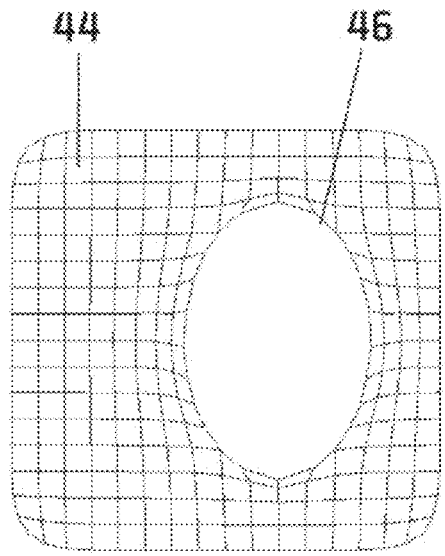

FIG. 4D shows polygonal object 44 after a second iteration of smoothing and conforming. As shown, the second iteration of smoothing and conforming has added vertices such that polygonal object 44 is smoother and rounder as compared to polygonal object 43 on which the smoothing and conforming operations were performed. In addition, the smoothing and conforming operations have generated vertices which conform to the reference geometry 41. In this embodiment, the projection paths of the moved vertices are determined according to the same scheme as the projection paths of the moved vertices discussed above with reference to FIGS. 4B and 4C. As shown, the polygonal object 44 is much smoother than the original polygonal object 42 and defines a curve 46 which conforms to the reference geometry curve 41.

FIGS. 5A-5H are graphical illustrations of a reference geometry 51, polygonal data 52, 53, 54, and 55, and projection geometry 57 at different points during an embodiment of a method of generating smoothed polygonal data 55. In this embodiment, smoothing and conforming operations are performed which are similar to the smoothing and conforming operations discussed above. In this embodiment, the reference object or geometry 51 is a plane, and the projection paths of new vertices which conform to reference geometry 51 determined with the projection geometry 57. In this embodiment, the projection path for each vertex is along a path including a point on the projection geometry 57 nearest the point for the vertex determined by the smoothing algorithm, and the point determined by the smoothing algorithm. In this embodiment the projection geometry 57 is a plane. In some embodiments the projection geometry is curved, is spherical, or is another shape. In some embodiments, multiple projection geometrics 57 may be used. For example, the user may cause the computer system to add a first projection geometry and may provide an indication to the computer system to determine projection paths for a selected subset of the vertices 58 base on the first projection geometry. Similarly, the user may cause the computer system to add a second projection geometry and may provide an indication to the computer system to determine projection paths for a selected subset of the vertices 58 based on the second projection geometry.

Figure 5A:
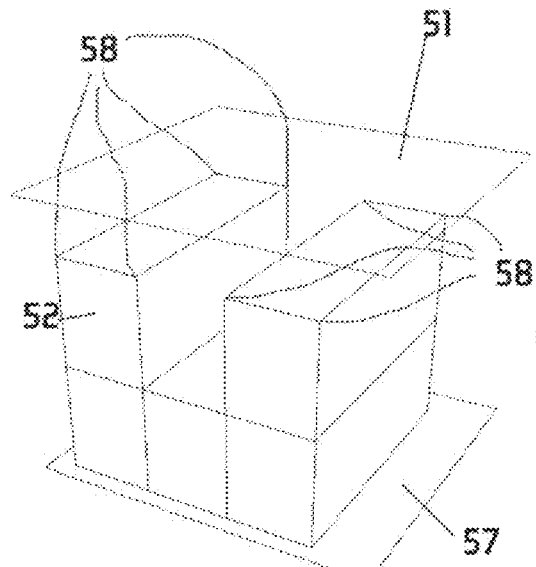
FIGS. 5A-5H are graphical illustrations of a reference geometry and polygonal data at different points during another embodiment of a method of generating smoothed polygonal data.
Figure 5C:
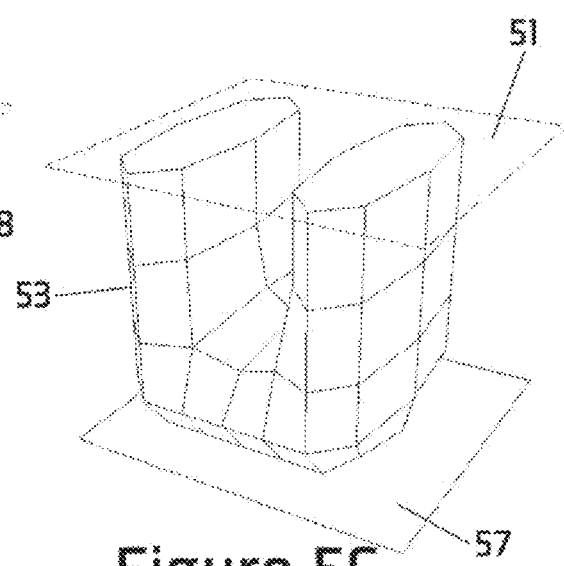
Figure 5B:
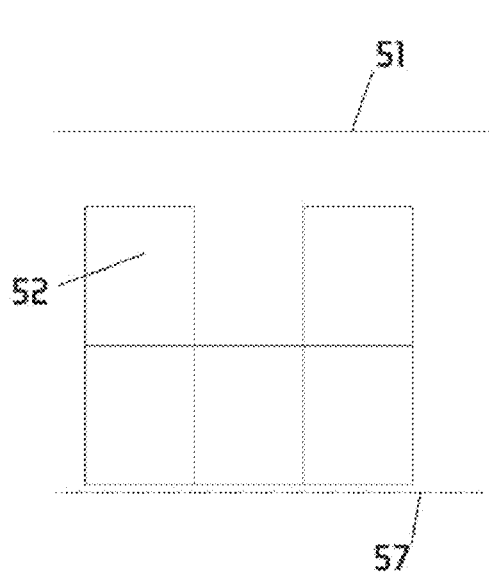

FIGS. 5A and 5B represent reference object 51, projection geometry 57, and polygonal data object 52 as accessed by the computer system and prior to smoothing and conforming. In some embodiments, prior to the smoothing and conforming operation, using the computer system, a user arranges and orients the polygonal data object 52, projection geometry 57, and the reference object 51 so as to have a desired spatial relationship. The user also provides an indication to the computer system to mark a portion of the polygonal data object 52 as that which is to conform to the reference object 51 during subsequent smoothing and conforming operations. In this embodiment, vertices 58 are marked. In addition, the user provides an indication as to how the designated portion is to conform to the reference object 51, such as what projection scheme is to be used and what projection geometrics are to be used.

Figure 5D:
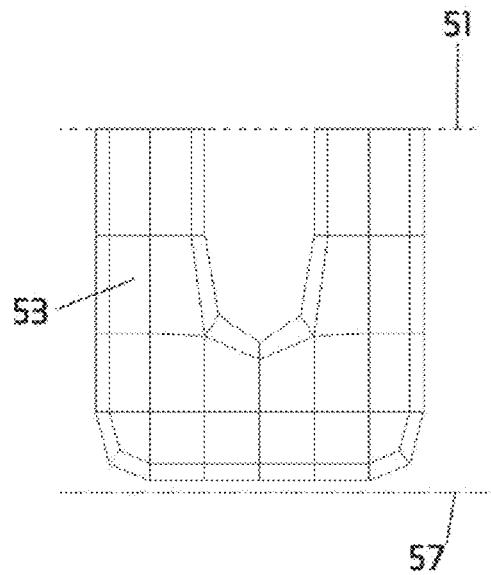

FIGS. 5C and 5D show polygonal object 53 after one iteration of smoothing and conforming. As shown, the smoothing and conforming has added vertices and located vertices such that polygonal object 53 is smoother and rounder as compared to polygonal data object 52 on which the smoothing and conforming operations were performed. In addition, the smoothing and conforming operations have generated the object 53 having vertices, which are on the reference geometry 51.

In some embodiments, a position is determined by a smoothing algorithm for each vertex without regard for the reference geometry 51. Subsequently, each marked vertex is projected from the position determined by the smoothing algorithm to the reference geometry 51 according to the projection geometry 57. In this embodiment, the direction for each of the projection paths is from a point on the projection geometry nearest each vertex to the pre-moved location of the vertex. Accordingly, the vertices 58 are moved from their positions determined by the smoothing algorithm to the reference geometry 51 along projection paths which are normal to the projection geometry 57 and intersect the positions determined by the smoothing algorithm and prior to projection.

Figure 5E:
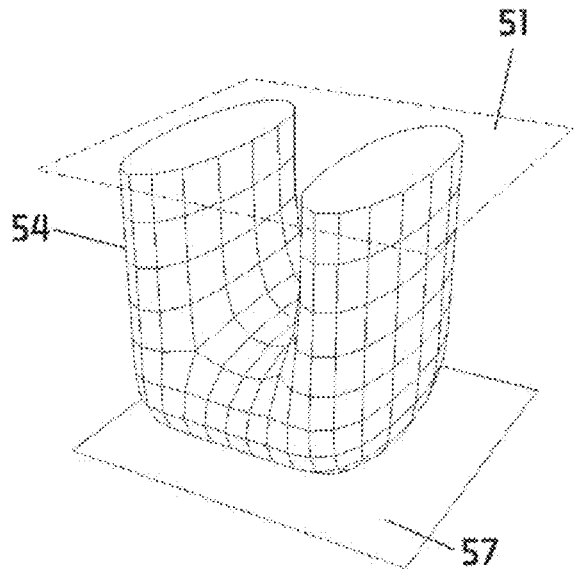
Figure 5G:
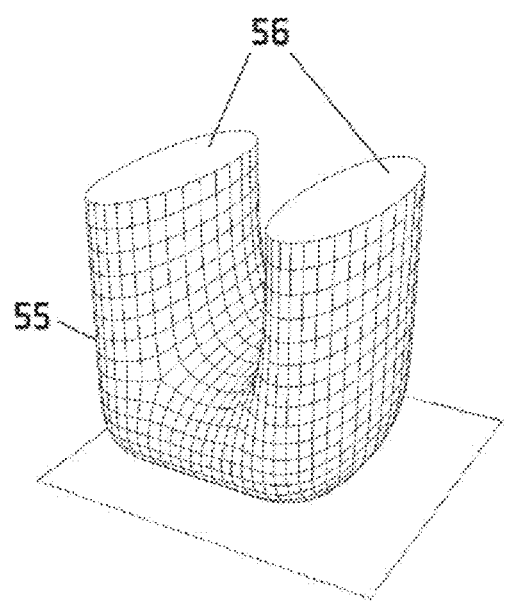
Figure 5F:
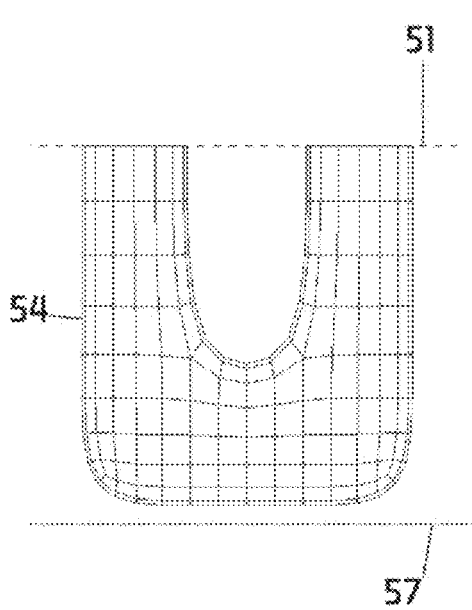

FIGS. 5E and 5F show polygonal object 54 after a second iteration of smoothing and conforming. As shown, the second iteration of smoothing and conforming has added and moved vertices such that polygonal object 54 is smoother and rounder as compared to polygonal object 53 on which the smoothing and conforming operations were performed. In addition, the smoothing and conforming operations have generated vertices of the object 54 which are on the reference geometry 51. In this embodiment, the projection paths of the moved vertices are perpendicular to the projection geometry 57.

Figure 5H:
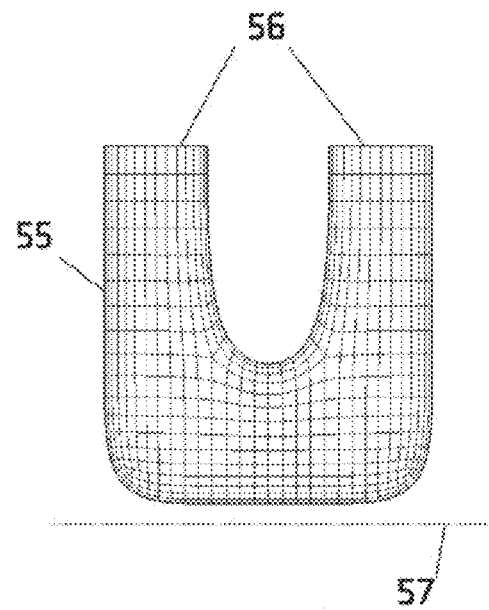

FIGS. 5G and 5H show polygonal object 55 after a third iteration of smoothing and conforming. As shown, the third iteration of smoothing and conforming has added vertices such that polygonal object 55 is smoother and rounder as compared to polygonal object 54 on which the smoothing and conforming were performed. In addition, the smoothing and conforming operations have generated vertices which conform to the reference geometry 51. In this embodiment, the projection paths of the moved vertices are determined according to the same scheme as the projection paths of the moved vertices discussed above with reference to FIGS. 5C and 5D and FIGS. 5E and 5F. As shown, the polygonal object 55 is much smoother than the original polygonal object 52 and defines two surfaces 56 which conform to the reference geometry 51.

FIGS. 6A-6H are graphical illustrations of multiple reference geometrics 61, and polygonal data 62, 63, 64, and 65 at different points during an embodiment of a method of generating smoothed polygonal data 65. In this embodiment, smoothing and conforming operations are performed which are similar to the smoothing and conforming operations discussed above. In this embodiment, the reference objects or geometrics 61 include a plane and a concave surface. The projection paths of new vertices which conform to reference geometrics 61 may be determined with one or more projection geometrics (not shown) or another method.

FIGS. 6A and 6B represent reference objects 61 and polygonal data object 62 as accessed by the computer system and prior to smoothing and conforming. In some embodiments, prior the smoothing and conforming operation, using the computer system, a user arranges and orients the polygonal data object 62 and the reference objects 61 so as to have a desired spatial relationship. The user also provides an indication to the computer system to mark a portion of the polygonal data object 62 as that which is to conform to the reference objects 61 during subsequent smoothing and conforming operations. In addition, the user provides an indication as to how the designated portion is to conform to the reference object 61, such as what projection scheme is to be used. In some embodiments, the marking operation includes the user providing an indication to the computer system regarding which reference object 61 each marked geometry of the polygonal data object 62 is to conform to. In this embodiment, vertices 67, 68, and 69 are marked. Vertices 67 are marked as being assigned to conform to the plane reference object 61. Vertices 68 are marked as being assigned to conform to the concave surface reference object 61. Vertices 69 are marked as being assigned to conform to both the plane reference object 61 and to the concave surface reference object 61.

FIGS. 6C and 6D show polygonal object 63 after one iteration of smoothing and conforming. As shown, the smoothing and conforming has added vertices and located vertices such that polygonal object 63 is smoother and rounder as compared to polygonal data object 62 on which the smoothing and conforming operations were performed. In addition, the smoothing and conforming operations have generated the object 63 having vertices, which are on the reference geometrics 61 according to the assignments discussed above.

In some embodiments, a position is determined by a smoothing algorithm for each vertex without regard for the reference geometry 61. Subsequently, each marked vertex is projected from the position determined by the smoothing algorithm to the reference geometry 61, according to, for example, a method described above. Other methods may be used.

Figure 6E:
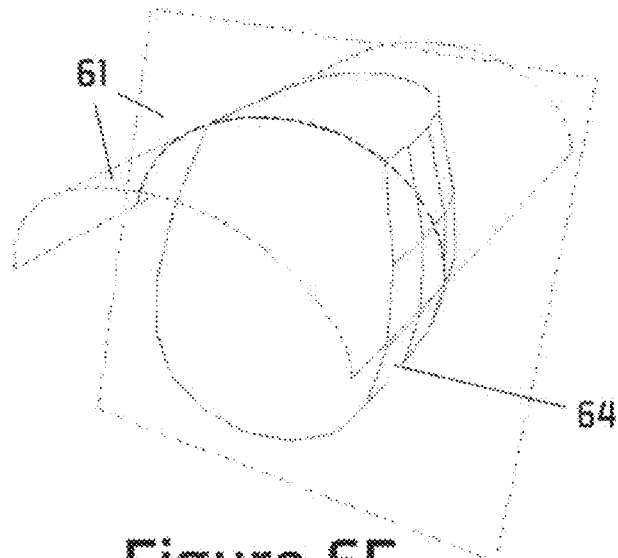
Figure 6G:
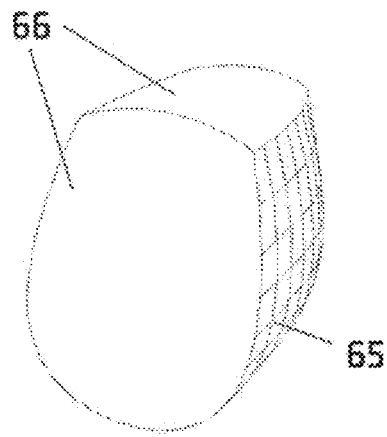
Figure 6F:
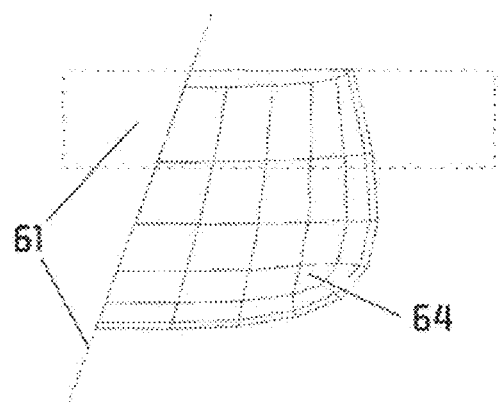

FIGS. 6E and 6F show polygonal object 64 after a second iteration of smoothing and conforming. As shown, the second iteration of smoothing and conforming has added and moved vertices such that polygonal object 64 is smoother and rounder as compared to polygonal object 63 on which the smoothing and conforming operations were performed. In addition, the smoothing and conforming operations have generated vertices of the object 64 which are on the reference geometrics 61.

Figure 6H:
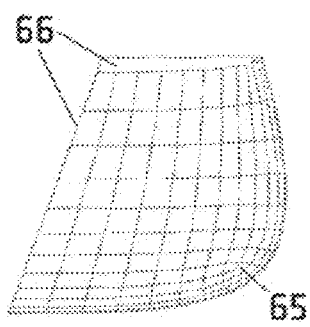

FIGS. 6G and 6H show polygonal object 65 after a third iteration of smoothing and conforming. As shown, the third iteration of smoothing and conforming has added vertices such that polygonal object 65 is smoother and rounder as compared to polygonal object 64 on which the smoothing and conforming operations were performed. In addition, the smoothing and conforming operations have generated vertices which conform to the reference geometrics 61. As shown, the polygonal object 65 is much smoother than the original polygonal object 62 and defines two surfaces 66 which conform to the reference geometrics 61.

FIGS. 7A-7H are graphical illustrations of multiple reference geometries 71, and polygonal data 72, 73, 74, and 75 at different points during an embodiment of a method of generating smoothed polygonal data 75. In this embodiment, smoothing and conforming operations are performed which are similar to the smoothing and conforming operations discussed above. In this embodiment, the reference objects or geometries 71 include three planes. The projection paths of new vertices which conform to reference geometries 71 may be determined with one or more projection geometries (not shown) or another method.

Figure 7A:
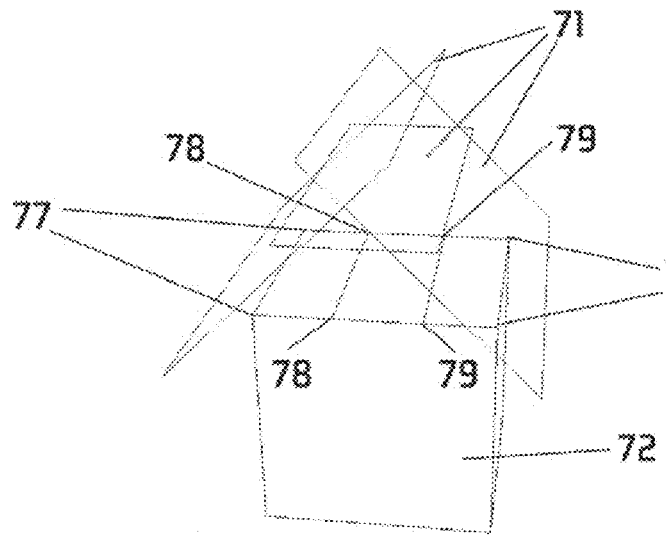
FIGS. 7A-7H are graphical illustrations of multiple reference geometrics and polygonal data at different points during another embodiment of a method of generating smoothed polygonal data.
Figure 7C:
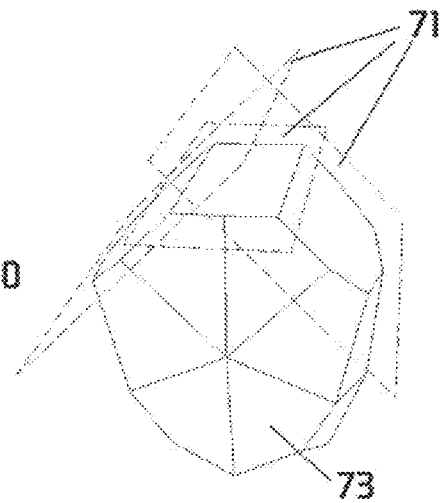
Figure 7B:
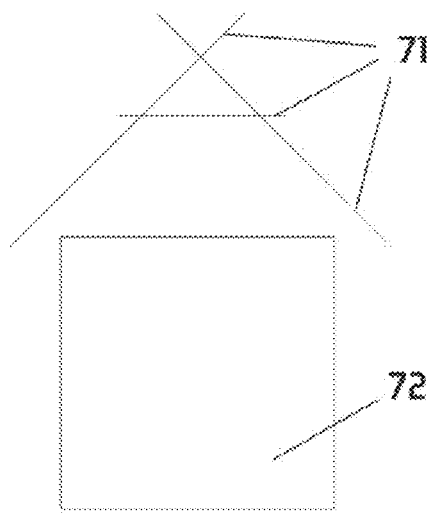

FIGS. 7A and 7B represent reference objects 71 and polygonal data object 72 as accessed by the computer system and prior to smoothing and conforming. In some embodiments, prior to the smoothing and conforming operation, using the computer system, a user arranges and orients the polygonal data object 72 and the reference objects 71 so as to have a desired spatial relationship. The user also provides an indication to the computer system to mark a portion of the polygonal data object 72 as that which is to conform to the reference objects 71 during subsequent smoothing and conforming operations. In addition, the user provides an indication as to how the designated portion is to conform to the reference object 71, such as what projection scheme is to be used. In some embodiments, the marking operation includes the user providing an indication to the computer system regarding which reference object 71 each marked geometry of the polygonal data object 72 is to conform to. In this embodiment, vertices 70, 77, 78, and 79 are marked. Vertices 70 are marked as being assigned to conform to the reference object 71 on the right of polygonal data object 72. Vertices 77 are marked as being assigned to conform to the reference object 71 on the left of polygonal data object 72. Vertices 78 are marked as being assigned to conform to the reference object 71 on the left of polygonal data object 72 and to the reference object 71 above polygonal data object 72. Vertices 79 are marked as being assigned to conform to the reference object 71 on the right of polygonal data object 72 and to the reference object 71 above polygonal data object 72.

Figure 7D:
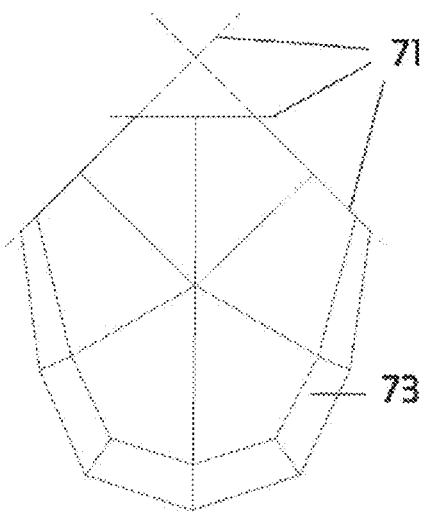

FIGS. 7C and 7D show polygonal object 73 after one iteration of smoothing and conforming. As shown, the smoothing and conforming has added vertices and located vertices such that polygonal object 73 is smoother and rounder as compared to polygonal data object 72 on which the smoothing and conforming operations were performed. In addition, the smoothing and conforming operations have generated the object 73 having vertices, which are on the reference geometrics 71 according to the assignments discussed above.

In some embodiments, a position is determined by a smoothing algorithm for each vertex without regard for the reference geometry 71. Subsequently, each marked vertex is projected from the position determined by the smoothing algorithm to the reference geometry 71, according to, for example, a method described above. Other methods may be used.

Figure 7E:
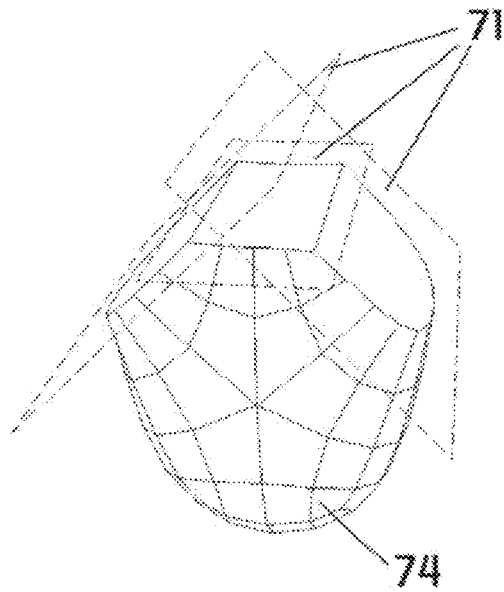
Figure 7G:
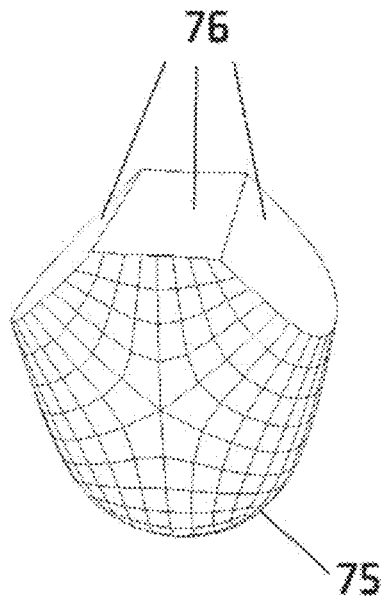
Figure 7F:
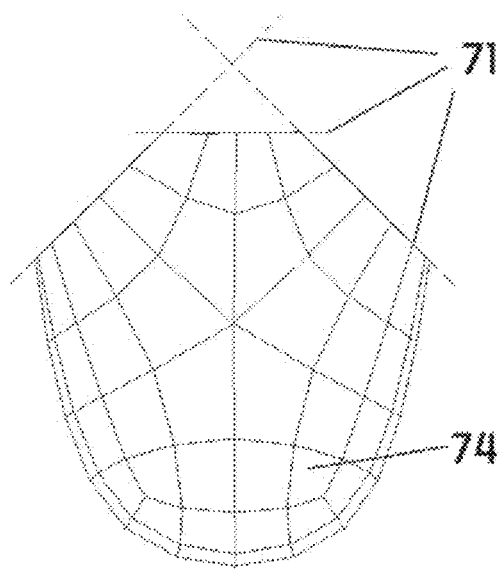

FIGS. 7E and 7F show polygonal object 74 after a second iteration of smoothing and conforming. As shown, the second iteration of smoothing and conforming has added and moved vertices such that polygonal object 74 is smoother and rounder as compared to polygonal object 73 on which the smoothing and conforming operations were performed. In addition, the smoothing and conforming operations have generated vertices of the object 74 which are on the reference geometrics 71.

Figure 7H:
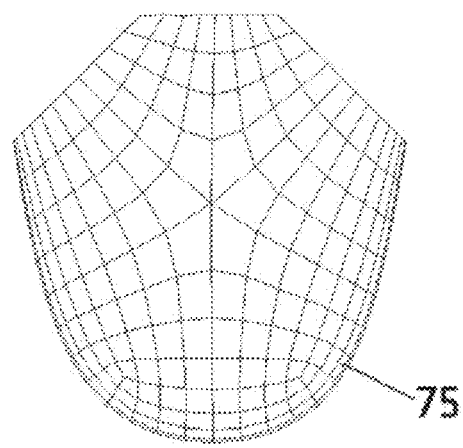

FIGS. 7G and 7H show polygonal object 75 after a third iteration of smoothing and conforming. As shown, the third iteration of smoothing and conforming has added vertices such that polygonal object 75 is smoother and rounder as compared to polygonal object 74 on which the smoothing and conforming operations were performed. In addition, the smoothing and conforming operations have generated vertices which conform to the reference geometrics 71. As shown, the polygonal object 75 is much smoother than the original polygonal object 72 and defines three surface 76 which conform to the reference geometrics 71.

Figure 8:
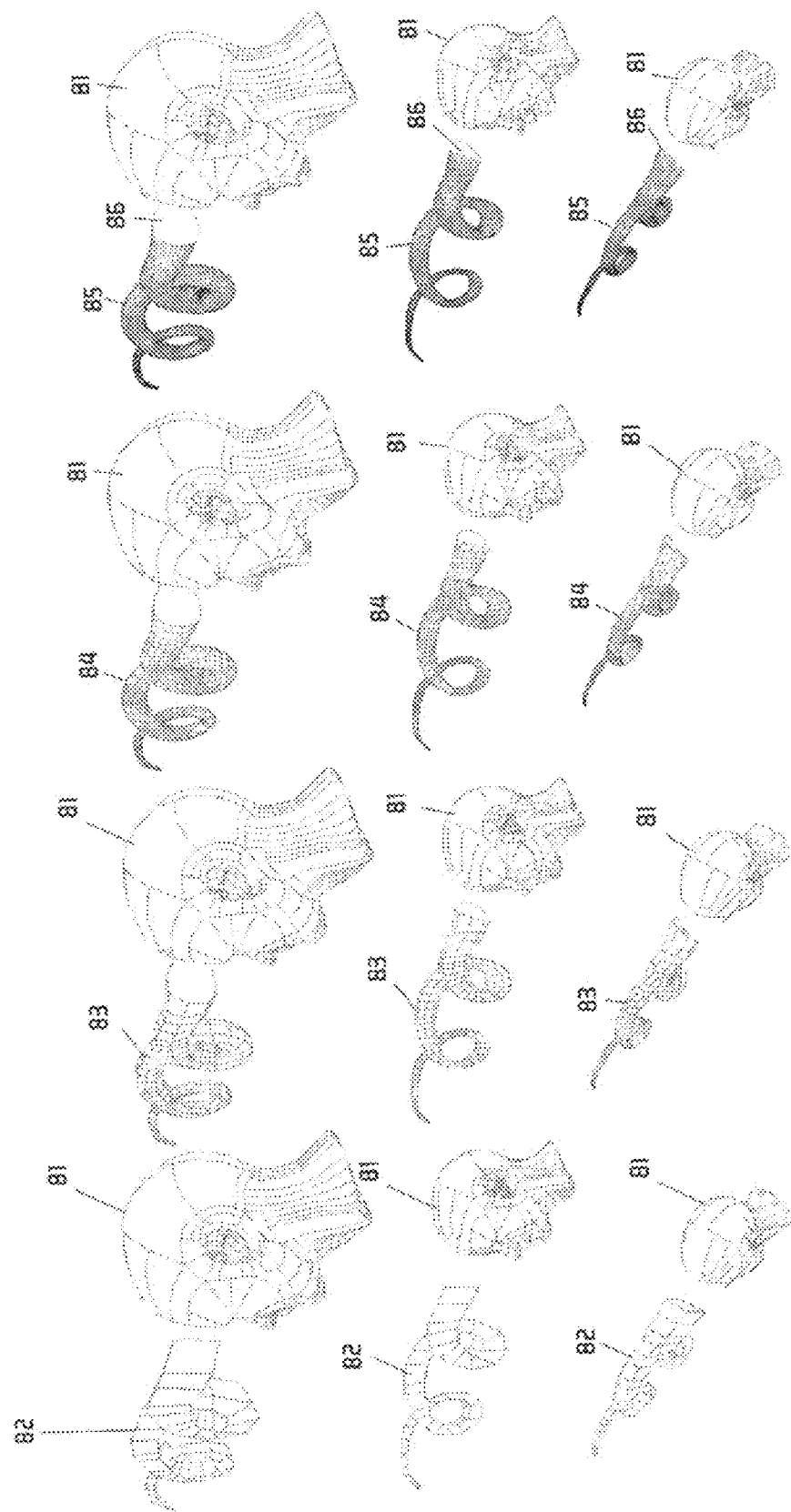
FIGS. 8 and 9 are graphical illustrations of a reference geometry and polygonal data at different points during other embodiments of methods of generating smoothed polygonal data.

FIG. 8 shows graphical illustrations of a reference geometry 81, and polygonal data 82, 83, 84, and 85 at different points during an embodiment of a method of generating smoothed polygonal data 85. In this embodiment, smoothing and conforming operations are performed which are similar to the smoothing and conforming operations discussed above. In this embodiment, the reference geometry 81 is a surface model of a human head and the polygonal data undergoing smoothing and conforming operations represents a stylized horn. As shown, after the polygonal data has undergone the smoothing and conforming operations, it has a surface 86 which conforms to the surface model of the human head.

Figure 9:
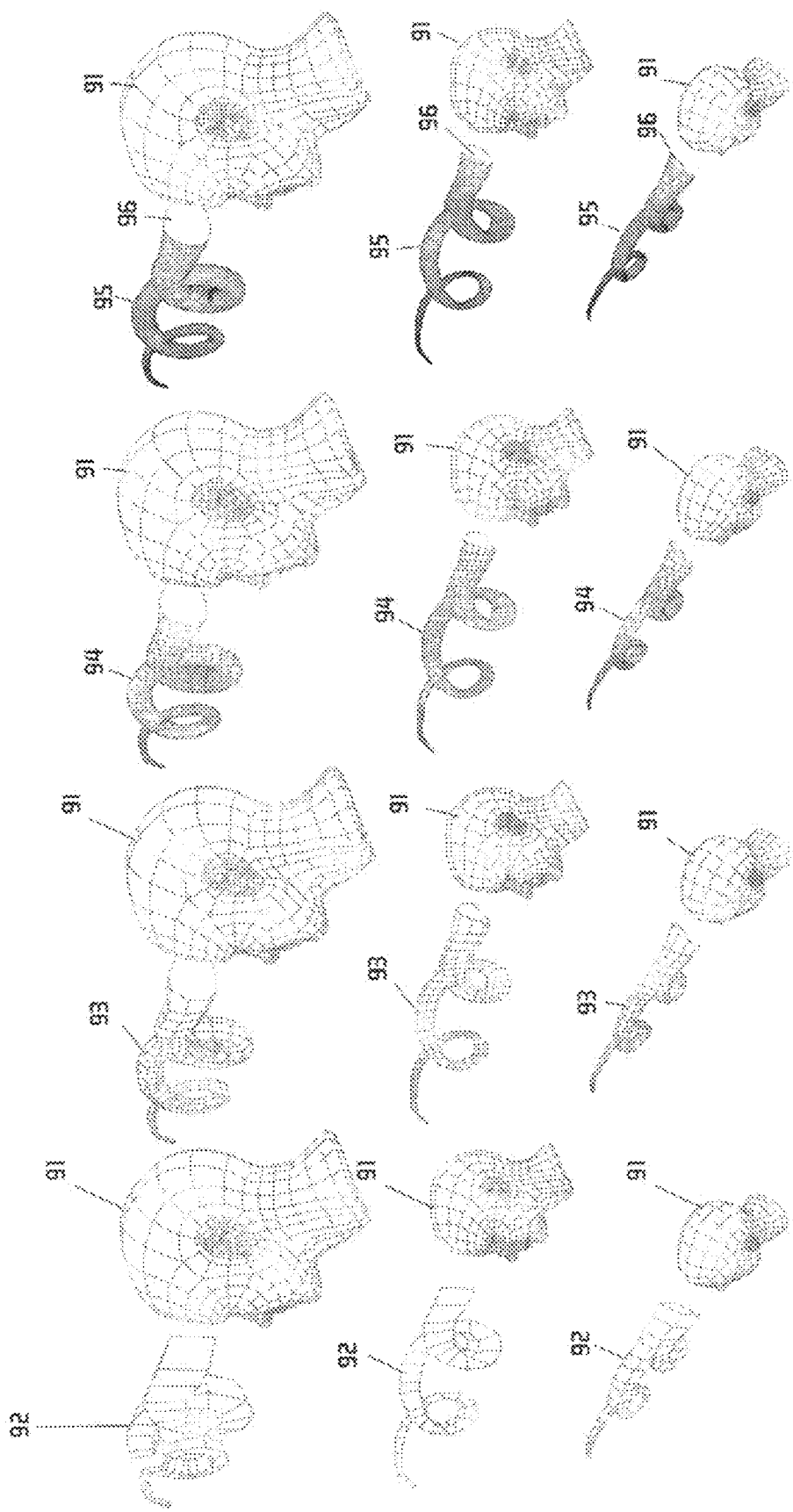

FIG. 9 is graphical illustrations of a reference geometry 81, and polygonal data 92, 93, 94, and 95 at different points during an embodiment of a method of generating smoothed polygonal data 95. In this embodiment, smoothing and conforming operations are performed which are similar to the smoothing and conforming operations discussed above. In this embodiment, the reference geometry 91 is a polygonal model of a human head and the polygonal data undergoing smoothing and conforming operations represents a stylized horn. As shown, after the polygonal data has undergone the smoothing and conforming operations, it has a surface 96 which conforms to the polygonal model of the human head.

FIGS. 10A-10D are graphical illustrations of polygonal data 102, 103, 104, and 105, at different points during an embodiment of a method of generating smoothed polygonal data 105. In this embodiment, smoothing and conforming operations are performed which are similar to the smoothing and conforming operations discussed above. As shown, a result of the smoothing and conforming operations is that the polygonal data 105 has a fillet 100. In some embodiments, the reference objects or geometrics are automatically generated.

Figure 10:
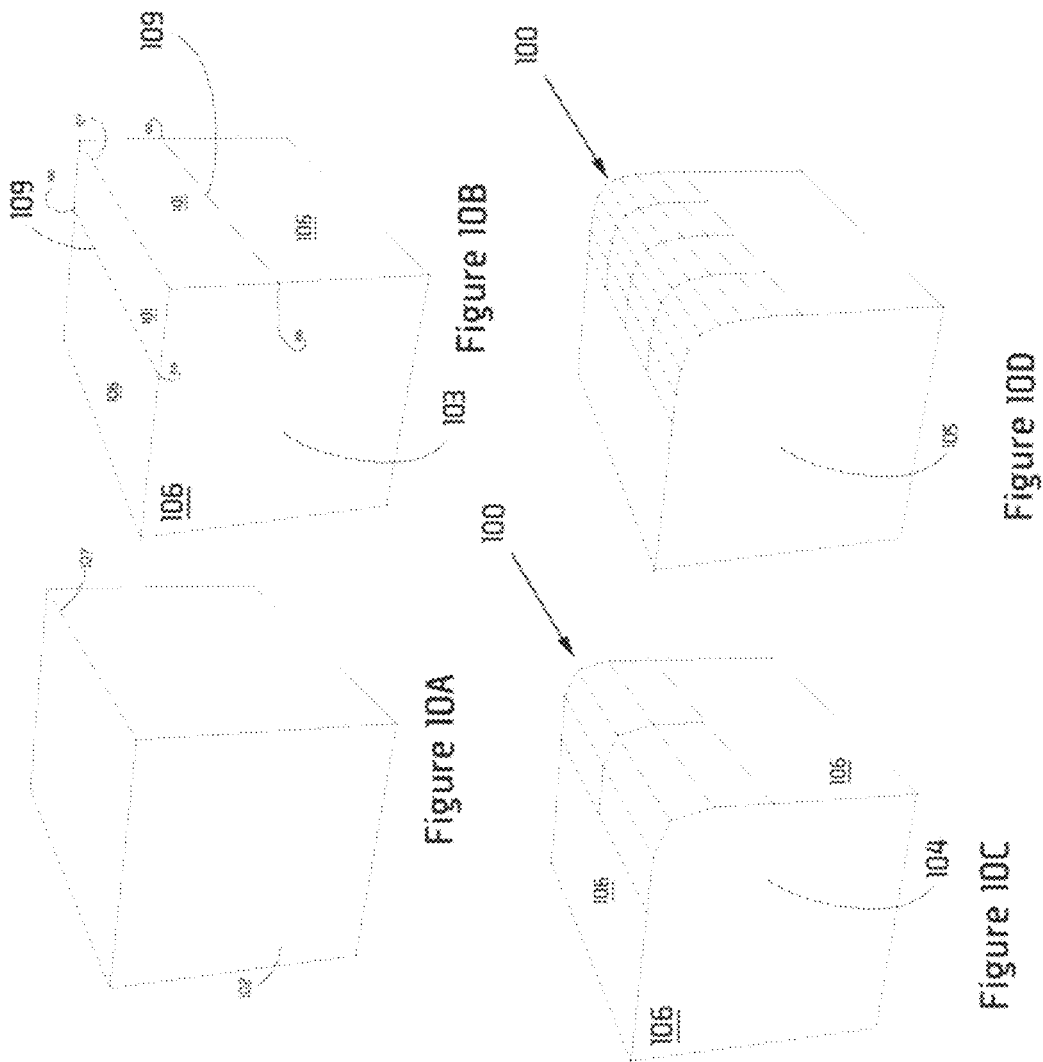
FIGS. 10A-10D are graphical illustrations of polygonal data at different points during an embodiment of a method of generating smoothed polygonal data.

FIG. 10A shows polygonal data object 102 as accessed by the computer system and prior to smoothing and conforming. Prior to the smoothing and conforming operations, a user provides one or more indications that a fillet is to be generated at edge 107. In some embodiments, one or more indications may be provided that a fillet is to be generated along each of multiple edges or along each of all of the edges of polygonal data 102. FIG. 10B shows polygonal data object 103, which is automatically generated in response to the indication from the user.

As shown in FIG. 10B, additional vertices 108 and additional edges 109 are added to the polygonal data object 102. In this embodiment, the additional edges 109 are adjacent to the filleting edge 107, are parallel to the filleting edge 107, and are set back a distance from the filleting edge 107. In some embodiments, the distance is determined based on an input from the user, and in some embodiments a default distance is automatically provided by the computer system. For example, the distance may be determined by the computer system based on the size of adjacent faces or other nearby geometrics. In some embodiments, a ratio, such as 1/2, 1/3, or 1/4 of the average length of edges near the filleting edge 107 may be used. In some embodiments, the additional edges 109 are not adjacent to the filleting edge 107. For example, one or more vertices or edges of polygonal data object 103 may be between the additional edge 109 and the filleting edge 107. In some embodiments the additional edge 109 is not parallel to the filleting edge. For example, the distance of one or more of the additional vertices 108 from the filleting edge 107 may be different from the distance of others of the additional vertices 108 from the filleting edge 107. The various distances may be determined based on an input from the user, or may be automatically generated by the computer system. For example, additional vertices 108 of a single additional edge 109 may be placed on edges of the polygonal data 102 which are of different lengths, where the distances of such additional vertices 108 from the filleting edge 107 are proportional to the different lengths. The computer system may use other methods of determining positions for the additional vertices 108 which are based on geometric aspects of the polygonal data 102.

Once the additional vertices 108 and edges 109 are added, surfaces to be constrained are determined, either in response to one or more specific indications from the user or automatically. For example, all surface except those between the additional edges 109 and the filleting edge 107 may be constrained. Such constraining causes each constrained surface, during subsequent smoothing and conforming operations, to conform to itself, as a reference object. Accordingly, a method such as those described above may be used, where the portion of the polygonal data object which is to conform to a reference object is the constrained surface and the reference object is also the constrained surface. In the embodiment shown in FIG. 10B, surfaces 106 are constrained and surfaces 101 are not constrained.

Prior to constraining, the addition of additional vertices 108 and edges 109 cause additional surfaces to be generated. The additional surfaces are between the additional edges 109 and the filleting edge 107, and, as discussed above, may be used to determine which surfaces to constrain. In some embodiments, instead of adding one or more of the additional vertices and edges, the computer system selects one or more vertices and/or edges which are already part of the polygonal data accessed by the system. The selected one or more vertices and/or edges may then be used by the system as if they were additional vertices 108 or additional edges 109.

FIG. 10C shows polygonal data object 104 after performing smoothing and conforming operations on polygonal data object 103. As a result of surfaces 106 being constrained, surfaces 106 in polygonal data object 104 are largely or entirely unchanged from surfaces 106 in polygonal data object 103. The unconstrained surfaces 101 which share filleting edge 107, however, are affected by the smoothing and conforming operations such that a fillet 100 is generated in polygonal data object 104.

FIG. 10D shows polygonal data object 105 after performing smoothing and conforming operations on polygonal data object 104. As a result of surfaces 106 being constrained, surfaces 106 in polygonal data object 105 are largely or entirely unchanged from surfaces 106 in polygonal data object 104. The unconstrained surfaces 101 of fillet 100, however, are affected by the smoothing and conforming operations such that fillet 100 is substantially smoother in polygonal data object 105 than in polygonal data object 104.

Figure 11:
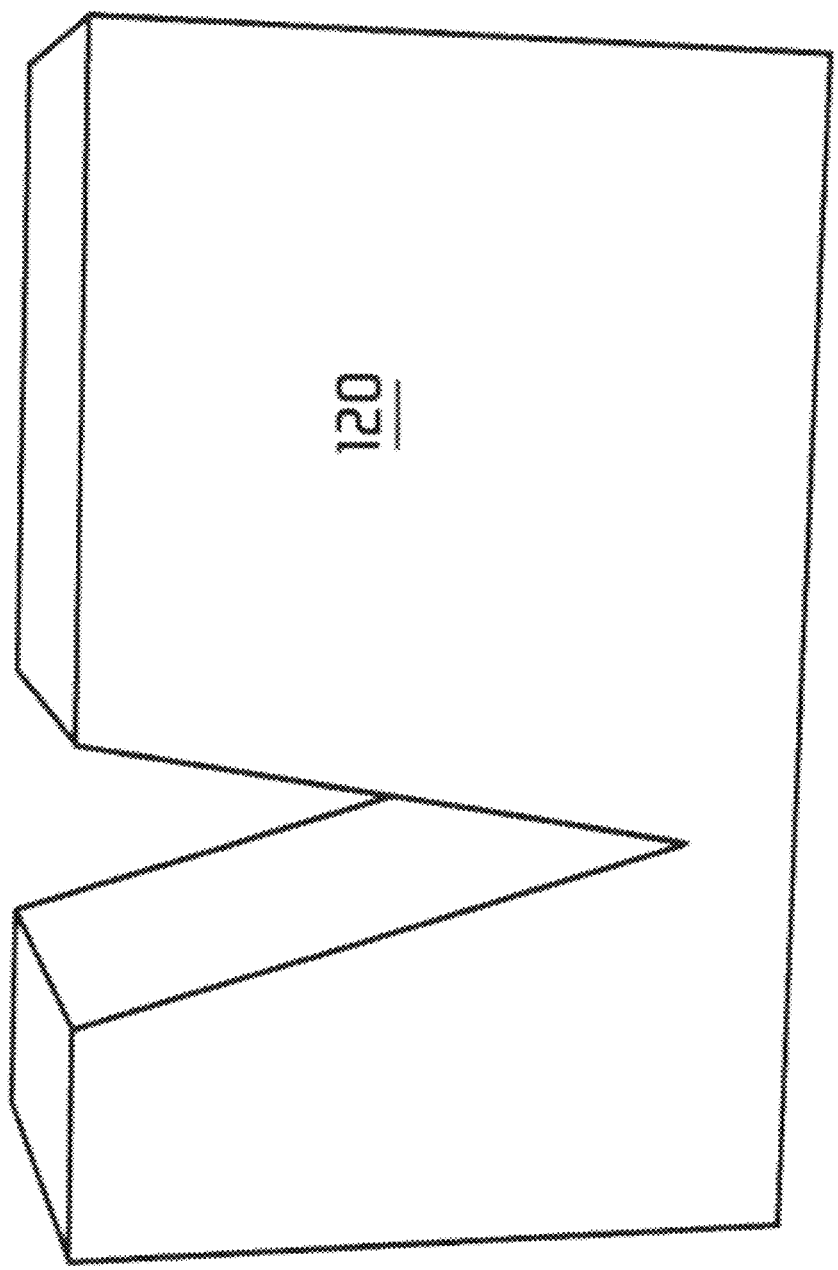
FIG. 11 is an illustration of a polygonal data object prior to smoothing.
Figure 128:
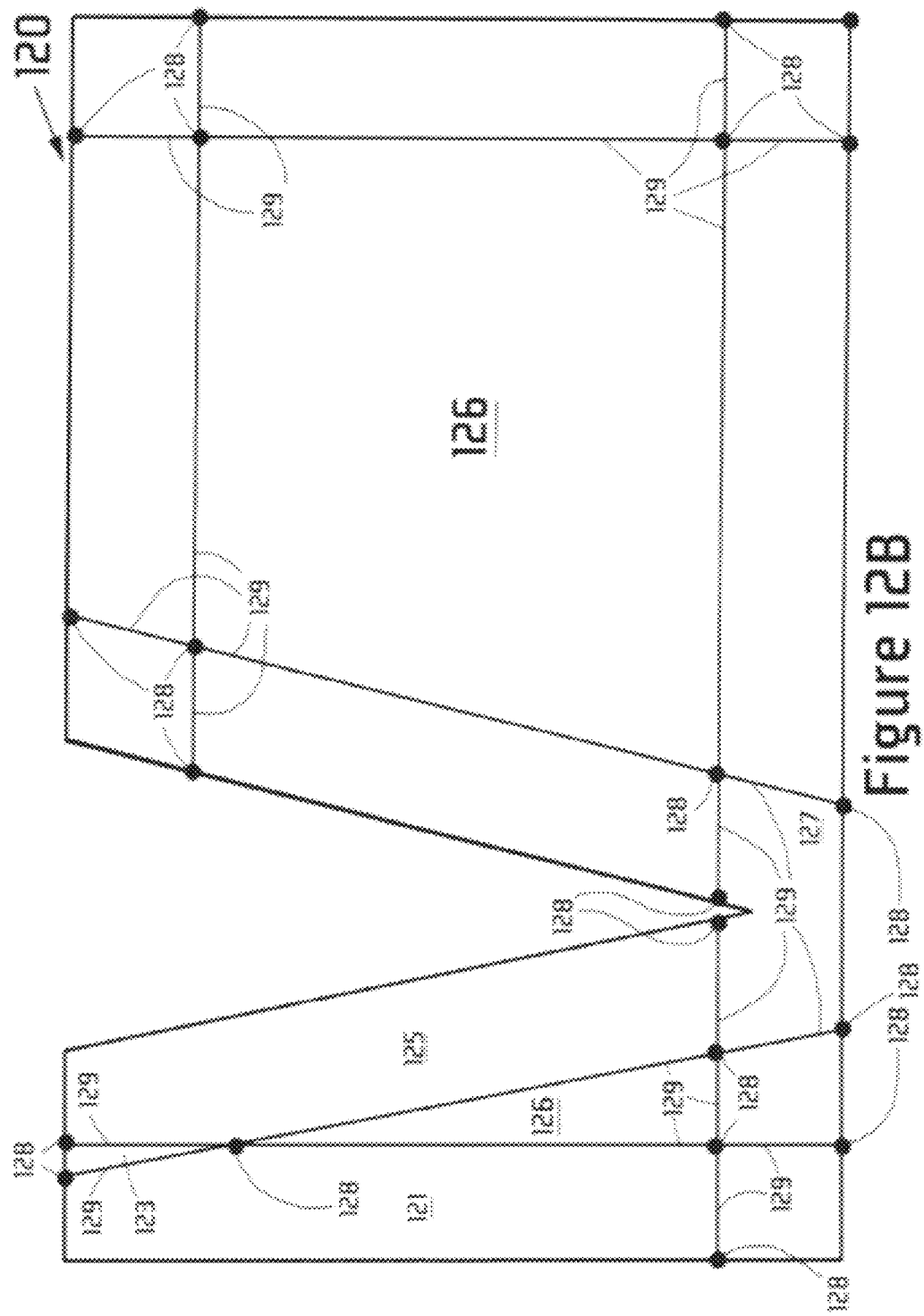

FIG. 11 is an illustration of polygonal data object 110 which has geometric features which are not included in polygonal object 102. Various methods may be used to determine locations for the additional vertices and edges for generating a fillet on data object 110.

FIG. 12A is an illustration of one side 120 of polygonal data object 110. In this embodiment, all edges of side 120 are to be filleted. As shown in FIG. 12A, lines 122 parallel to each edge of side 120 are calculated to be offset a constant distance from each edge on the interior of the side 120. As shown, the lines 122 which span a corner concave from the interior of side 120 extend to the boundary of the side 120 and lines 122 which span a corner convex from the interior of side 120 extend only to the intersection of the lines 122. The lines 122 define boundaries of regions 126 which are farther from the boundaries of the side 120 than the lines 122.

FIG. 12B is an illustration of side 120 having additional edges 129 and additional vertices 128 which bound the regions 126 and in locations where the lines 122 corresponding to the edges bounding regions 126 extend to intersect the boundary of side 120. In some embodiments, the additional edges 129 and additional vertices 128 bound all of the regions which are farther from the boundaries of the side 120 than the separation of lines 122 from the boundaries of the side 120. In some embodiments, it is preferable that faces which are not constrained have four edges. As shown in FIG. 12B, faces 121, 123, 125, and 127 do not have four faces. Accordingly, in some embodiments, actions are taken to further modify the data so that more or all faces which are to be smoothed have four edges. Numerous methods of causing the smoothed faces to have four edges may be used, some of which are discussed below. These and other methods discussed herein may be performed either automatically by the computer system or in response to incremental commands from a user.

FIG. 12C is an illustration of side 120 having further modifications so that all faces which are to be smoothed have four edges. Face 123, having three sides, can be removed by removing one of the edges which is not on the boundary of side 120. In this embodiment the edge more perpendicular to the boundary edge is preserved.

Faces 121 and 125 each have five edges. Faces with five edges can be converted to two faces having four edges each. To accomplish this, an additional edge 129a is generated at a location between an existing vertex and an added vertex 128a. The added vertex 128a is added to the edge on the fived edged face which is opposite from the existing vertex. In this embodiment, the added vertex 128a is placed so that the shortest possible additional edge 129a is generated. In some embodiments, the existing vertex is on the boundary of side 120 and the added vertex 128a is on the interior of side 120.

Face 127 has seven edges. To reduce the number of edges, a vertex on the boundary of side 120 which is between collinear edges may be removed and an edge on the interior of side 120 previously ending in the removed vertex may be may be moved to a next vertex. In the example of FIG. 12B, vertices near the apex of the notch are removed, and the edges 129b previously ending at the removed vertices are moved so as to end in the next vertex of face 127. Once edges 129b have been moved, face 127 has five edges, and, as shown, may be converted into two faces having four edges each using a method such as that described above. Alternatively, because the two vertices of face 127 on the lower boundary of side 120 are each between collinear edges, either of these vertices may be removed and the edge ending therein moved as discussed above. Alternatively, a new vertex may be added between, for example, in the middle of the two vertices. The two vertices may be removed and the edges ending in the two vertices may be moved so as to end at the new vertex.

Figure 12D:
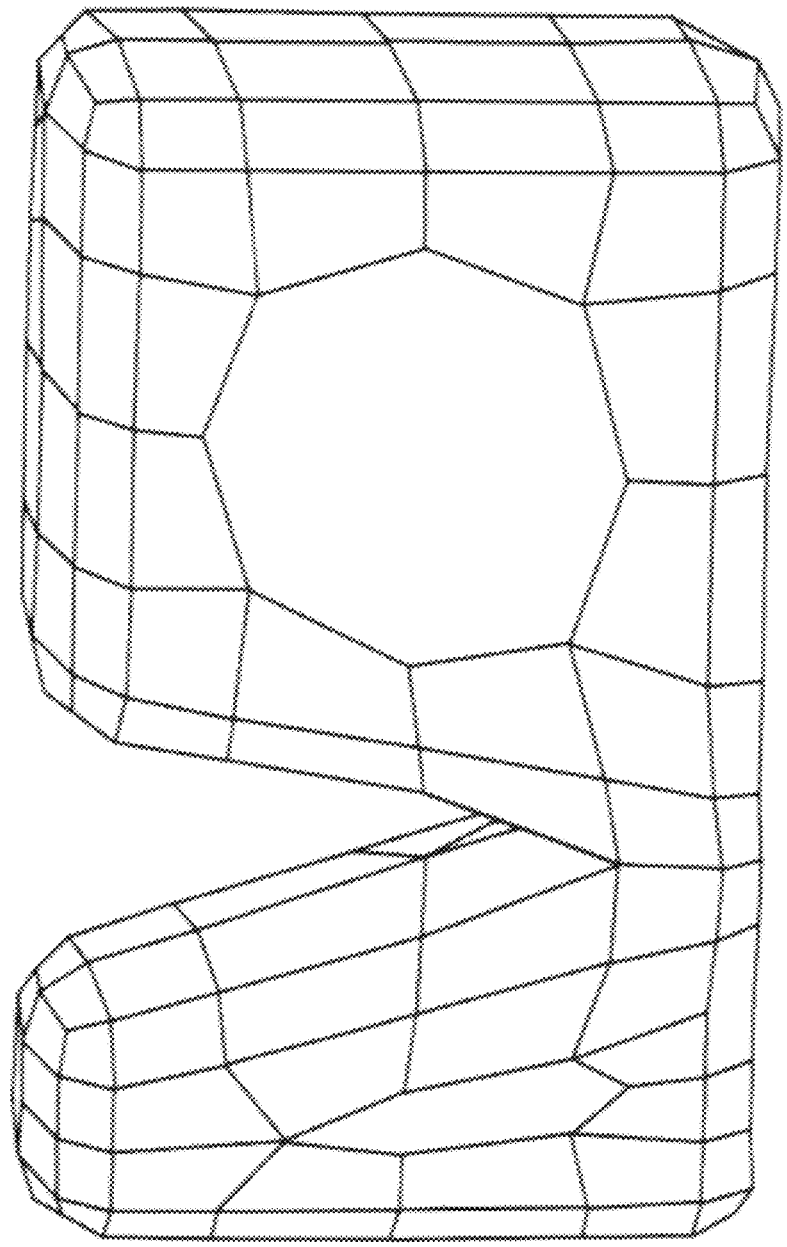

Once the additional edges 129 and vertices 128 are generated, surfaces to be constrained are determined by a method such as that discussed above with regard to FIG. 10B. For example, in this embodiment, the surfaces corresponding to the regions 126 may be constrained similarly to the constraining of surfaces 106 discussed above. Following the constraining of the surfaces corresponding to the regions 126 and other surfaces of polygonal data object 110, smoothing and conforming operations are performed on polygonal data object 110. As shown in FIG. 12D, fillets are produced by the smoothing and conforming operations.

FIG. 13A is an illustration of side 120 of polygonal data object 110. In this embodiment, all edges of side 120 are to be filleted. As shown in FIG. 13A, lines 132 are calculated similarly to the calculation of lines 122 of FIG. 12A discussed above. As shown, a result is that multiple regions 136 which are farther from the boundaries of the side 120 than the lines 132 are created. This may not be desirable.

Figure 13B:
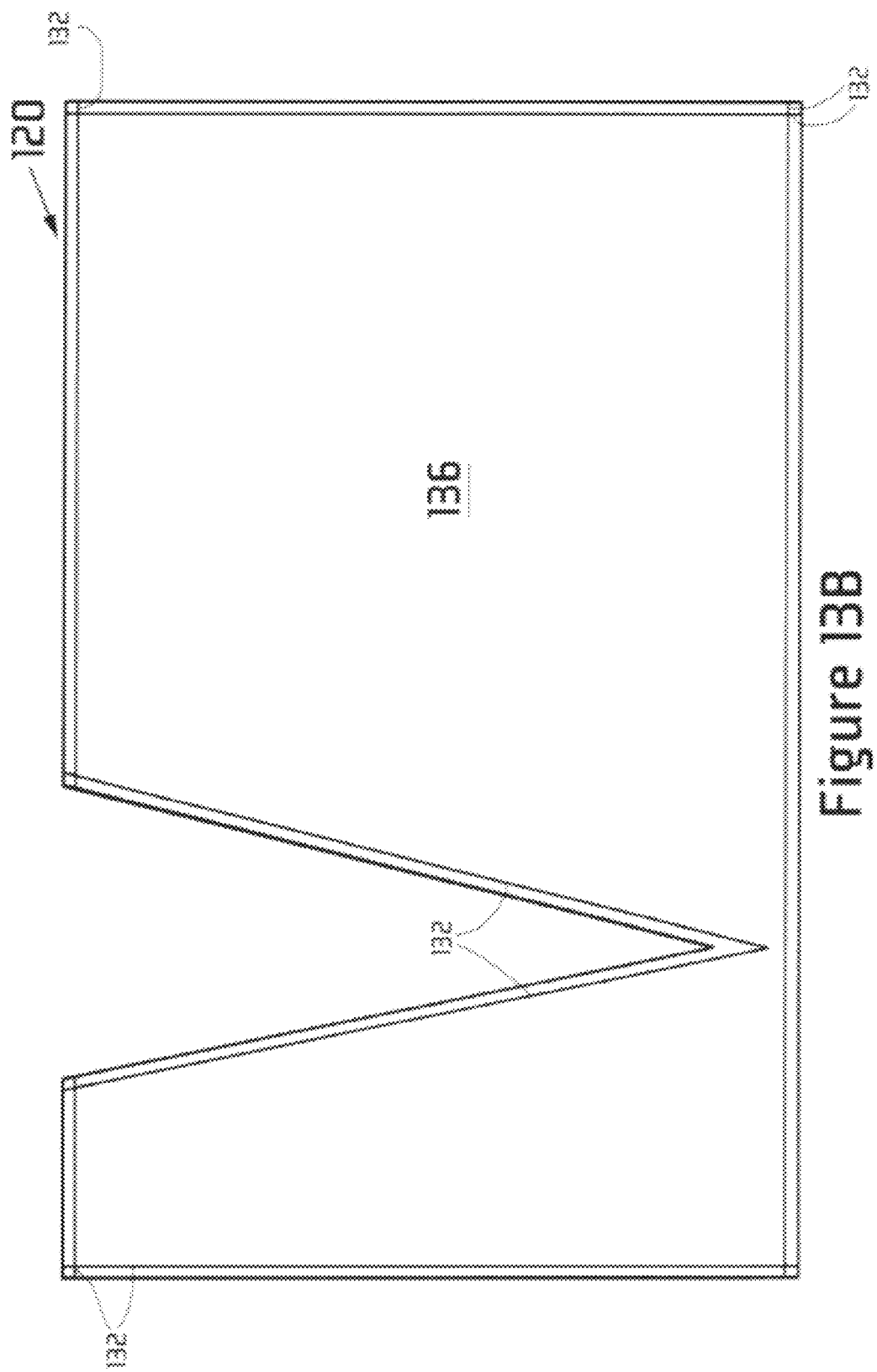

If a single region 136 is desired, the distance separating the lines 132 and the boundaries of side 120 may be reduced so that a single region 136 is achieved. For example, FIG. 13B is an illustration of side 120 of polygonal data object 110 showing an embodiment with a single region 136. To achieve the single region 136, the distance between the boundary of side 120 and the lines 132 has been reduced. In some embodiments, the computer system reduces the distance in response to an indication from the user. The extent of the reduction may be determined automatically based on, for example, relative widths of the distance and a minimum width of the single region 136, or by an input from the user. In some embodiments, in response to each of multiple indications from the user, the distance is reduced incrementally, such that the extent of the reduction is determined by the user.

FIG. 13C is an illustration of side 120 of polygonal data object 110 showing edges 134 and vertices 138, which have been added in preparation for smoothing and conforming. In this embodiment, vertices 138 are added where lines 132 intersect each other or intersect the boundary of the side 120. In this embodiment, edges 134 are added to the locations corresponding to the locations of lines 132. In addition, an edge 134a is added between the convex corner on the boundary of the side 120 and the vertex 138 nearest thereto. This is done to convert the face having six edges into two faces each having four edges by adding an edge between opposing vertices on the face having six edges.

In some embodiments, fewer edges around the perimeter of side 120 is preferable. To reduce the number of perimeter edges, as discussed above, vertices between collinear edges may be removed and edges ending therein moved to end in adjacent vertices. In the example of FIG. 13C, if such operations were to be performed, vertices on the boundary of side 120 would be only on the corners of the boundary, and each boundary vertex would have an edge extending there from to a corresponding vertex on the interior of side 120.

Figure 13D:
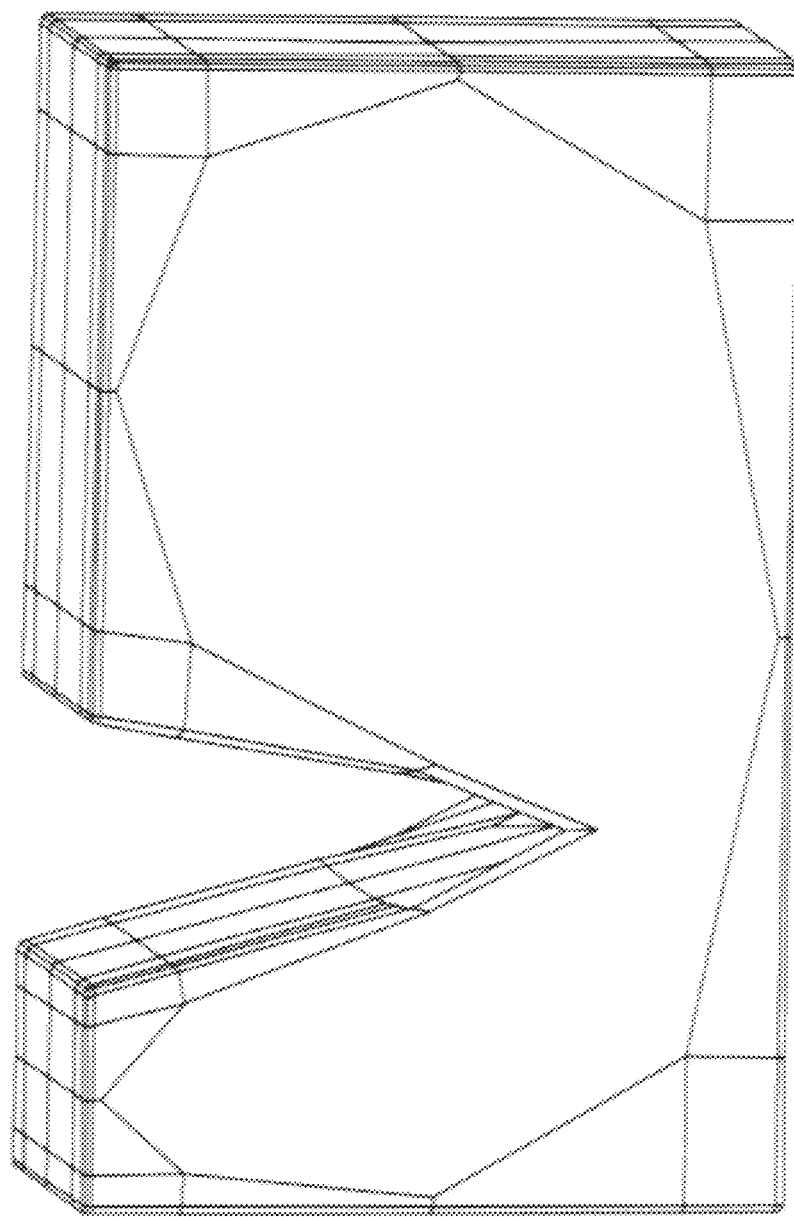

Once the additional edges 134 and vertices 138 are generated, surfaces to be constrained are determined by a method such as that discussed above. For example, in this embodiment, the surfaces corresponding to the regions 136 may be constrained similarly to the constraining of surfaces discussed above. Following the constraining of the surfaces corresponding to the regions 136 and other surfaces of polygonal data object 110, smoothing and conforming operations are performed on polygonal data object 110. As shown in FIG. 13D, fillets are produced by the smoothing and conforming operations.

Figure 14A:
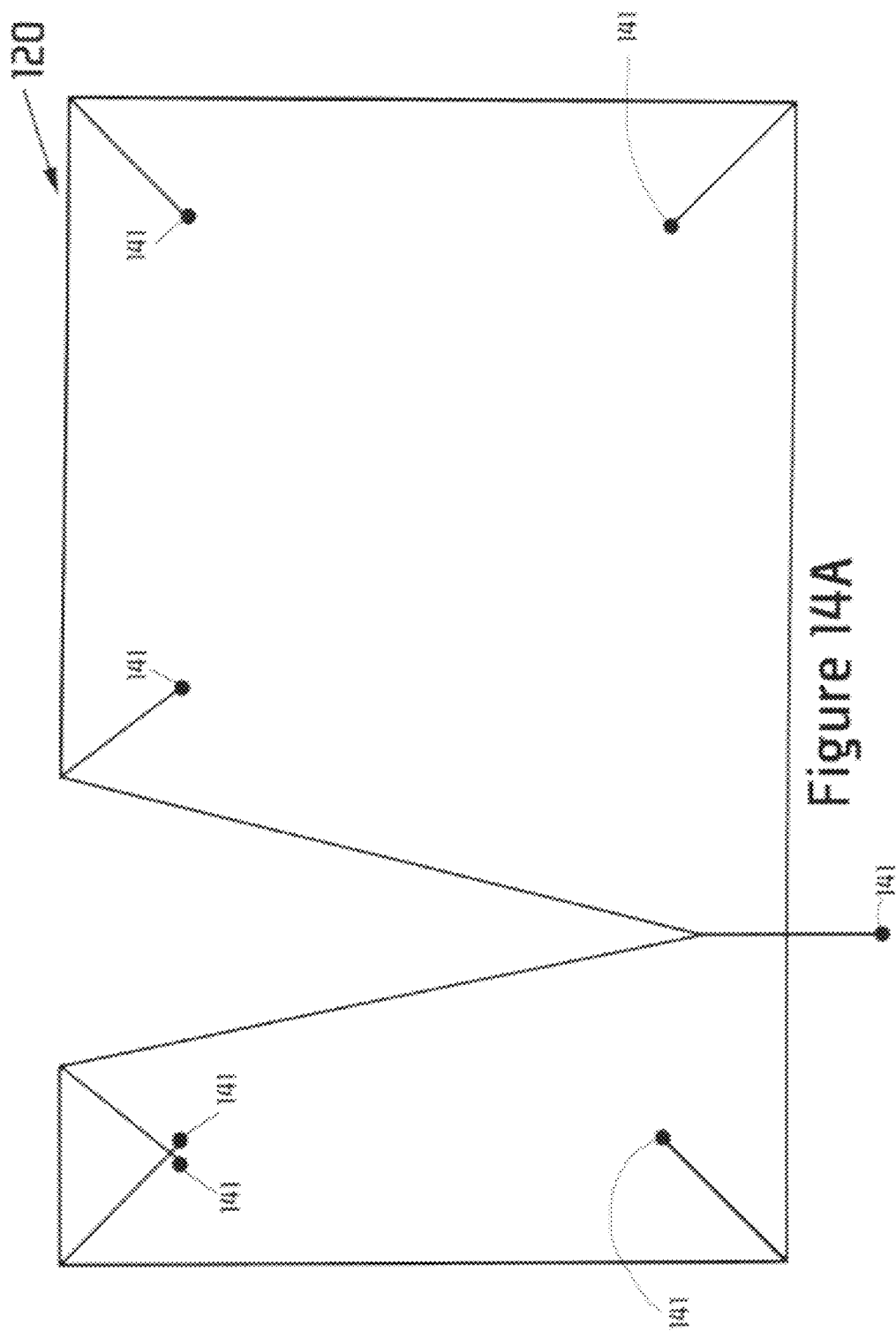

FIG. 14A is an illustration of side 120 of polygonal data object 110. In this embodiment, all edges of side 120 are to be filleted. Referring to FIG. 14A, points 141 are positioned a constant distance from each corner of side 120. In this embodiment, the points 141 are each placed at the end of one of multiple lines, where the lines have the same length. Each line starts at a corner of side 120 and extends toward the interior of the side 120 along a direction which bisects the angle of the corner.

Figure 14B:
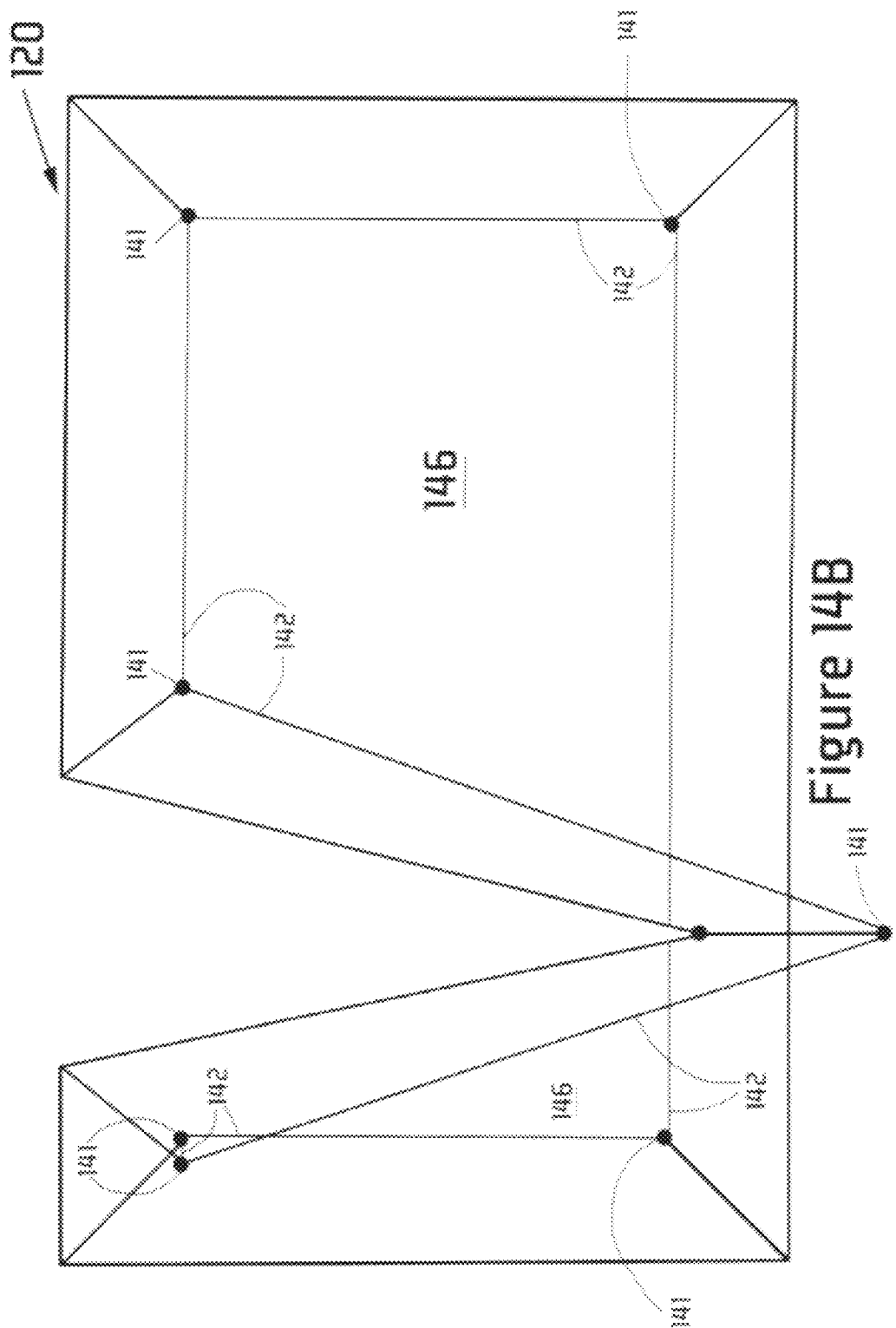

FIG. 14B is an illustration of side 120 where lines 142 have been generated, where each line 142 connects adjacent points 141 following the perimeter of side 120. The lines 142 define boundaries of regions 146 which are farther from the boundaries of the side 120 than the lines 142.

FIG. 14C is an illustration of side 120 where edges 144 and vertices 148 have been added. In this embodiment, additional vertices 148 are generated in locations corresponding to the locations of the points 141. Additional edges 144 are generated in locations corresponding to the locations of the lines 142 which define the boundaries of regions 146. In addition, additional edges 144 are generated between each of the added vertices 148 and a nearest corner of the side 120. As discussed above, for some smoothing and conforming operations, the faces which are affected have preferably four edges. Faces 143 and 147, however, have more than four edges.

FIG. 14D is an illustration of side 120 which has been modified so that the problem of face 147 having five edges is resolved. Face 147 have five edges is a result of the upper left corner of the boundary of side 120 not having an additional vertex and a corresponding edge. Accordingly, additional vertex 148a is generated at a point near the vertex 148b, which is the additional vertex closest to the corner having no additional vertex associated therewith. Additional edges 144a are added between the vertex 148a and each of vertex 148b and the vertex on the corner of the boundary. Furthermore, additional edge 144b is moved so as to be connected to additional vertex 148a instead of additional vertex 148b.

Figure 14E:
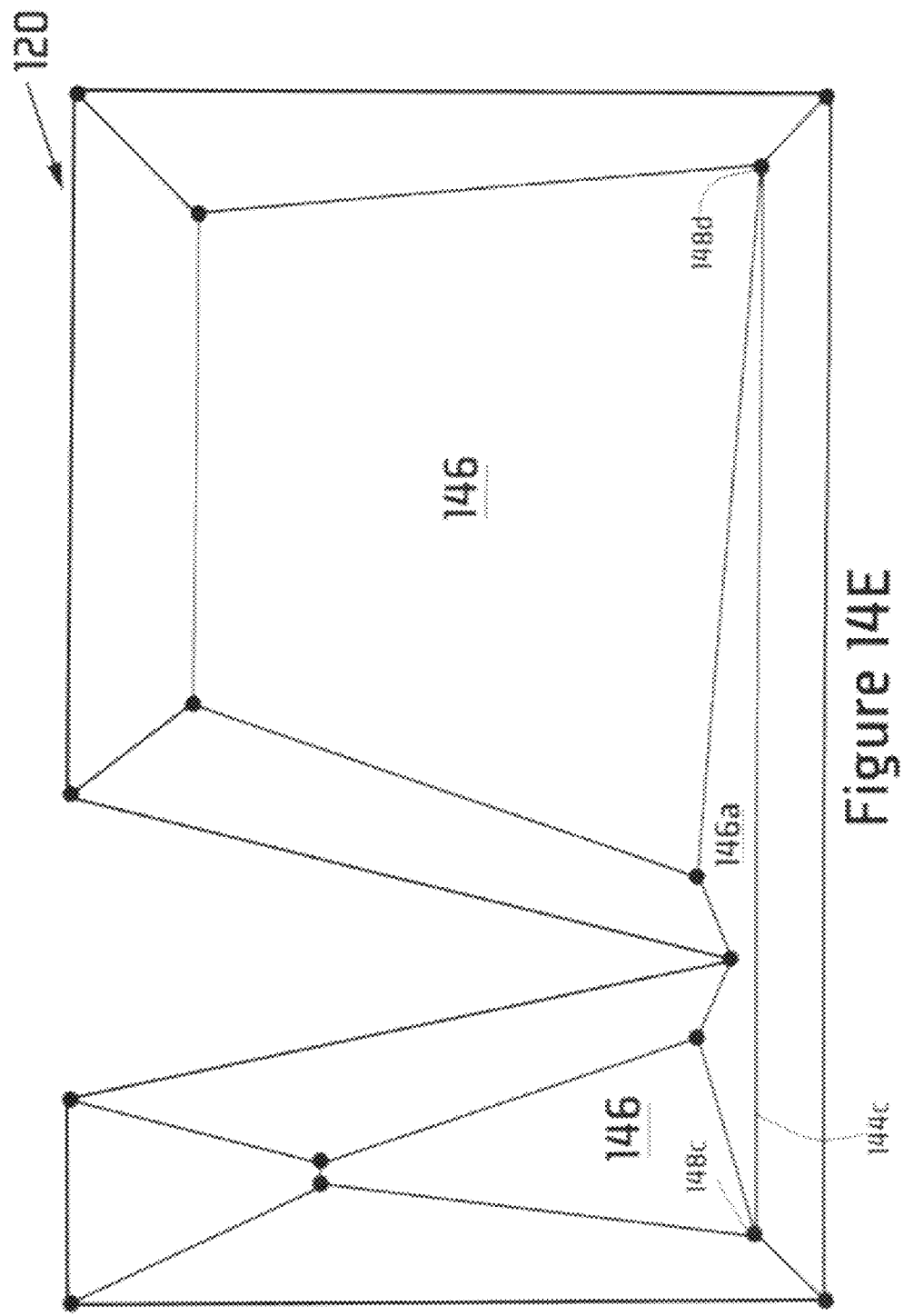

FIG. 14E is an illustration of side 120 which has been modified so that the problem of face 143 having more than four edges is resolved. Face 143 has more than four edges because additional vertices 148c and 148d, which are generated based on adjacent boundary corners are not connected by a single additional edge. In some embodiments, a face having four edges is generated by respectively moving vertices 148c and 148d closer to the boundary corners associated therewith so that an additional edge 144c may be generated which does not intersect other additional edges 144. Once additional edge 144c is generated, another face 146a, which is internal to side 120, is created.

Figure 14F:
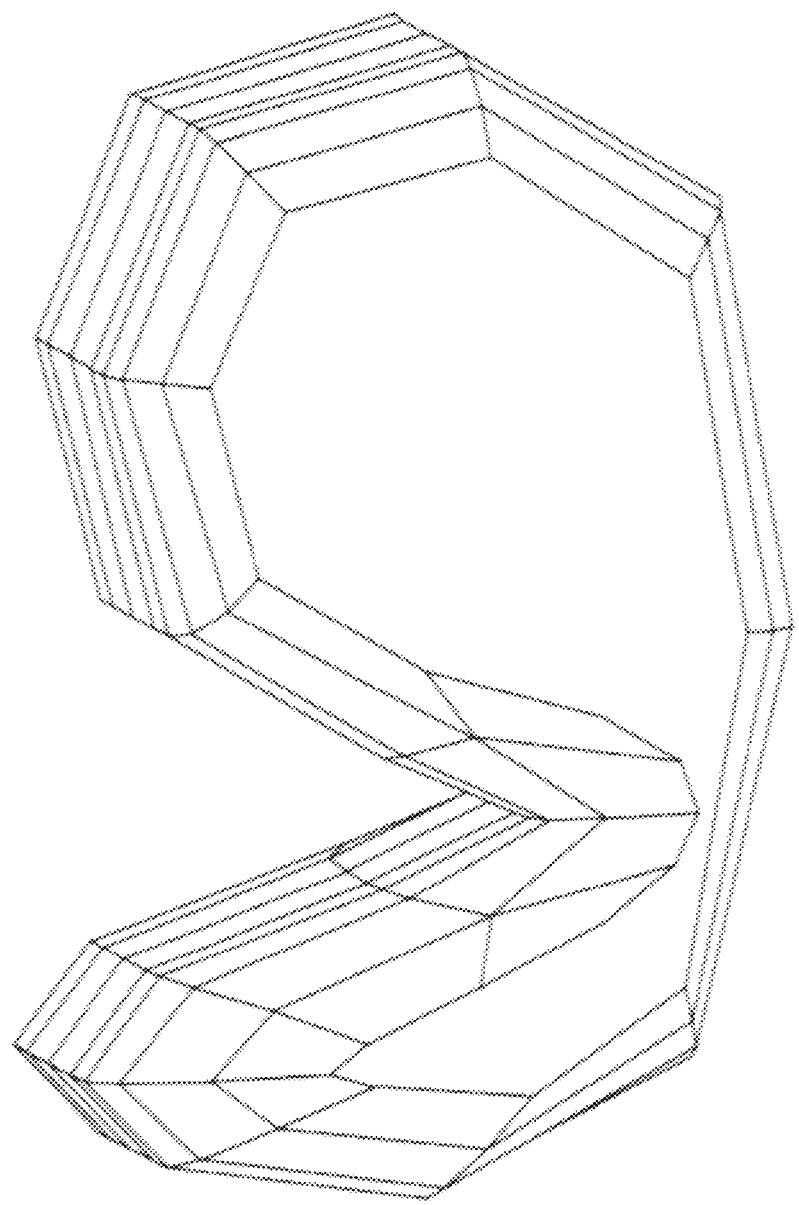

Once the additional edges and vertices are generated, surfaces to be constrained are determined by a method such as that discussed above. For example, in this embodiment, the surfaces corresponding to the regions 146 and face 146a may be constrained similarly to the constraining of surfaces discussed above. Following the constraining of the surfaces, smoothing and conforming operations are performed on polygonal data object 110. As shown in FIG. 14F, fillets are produced by the smoothing and conforming operations.

FIG. 15A is an illustration of side 120 of polygonal data object 110. In this embodiment, all edges of side 120 are to be filleted. Referring to FIG. 15A, points 151 are positioned a constant distance from each corner of side 120. In this embodiment, the points 151 are each placed at the end of one of multiple lines, where the lines have the same length. Each line starts at a corner of side 120 and extends toward the interior of the side 120 along a direction which bisects the angle of the corner. Similar to the embodiment discussed above with reference to FIGS. 14A-14F, a result of the positions of the points 151 is that multiple regions are defined which are farther from the boundaries of the side 120 than lines connecting the points. This may not be desirable.

If a single region which is farther from the boundaries of the side 120 is desired, or for other reasons, the distance separating each of the points 151 and the corresponding corner of side 120 may be reduced. In some embodiments, in response to each of multiple indications from the user, the distance is reduced incrementally, such that the extent of the reduction is determined by the user. In some embodiments, the computer system reduces the distance in response to an indication from the user. The extent of the reduction may be determined automatically based on, for example, a set of rules.

Figure 15B:
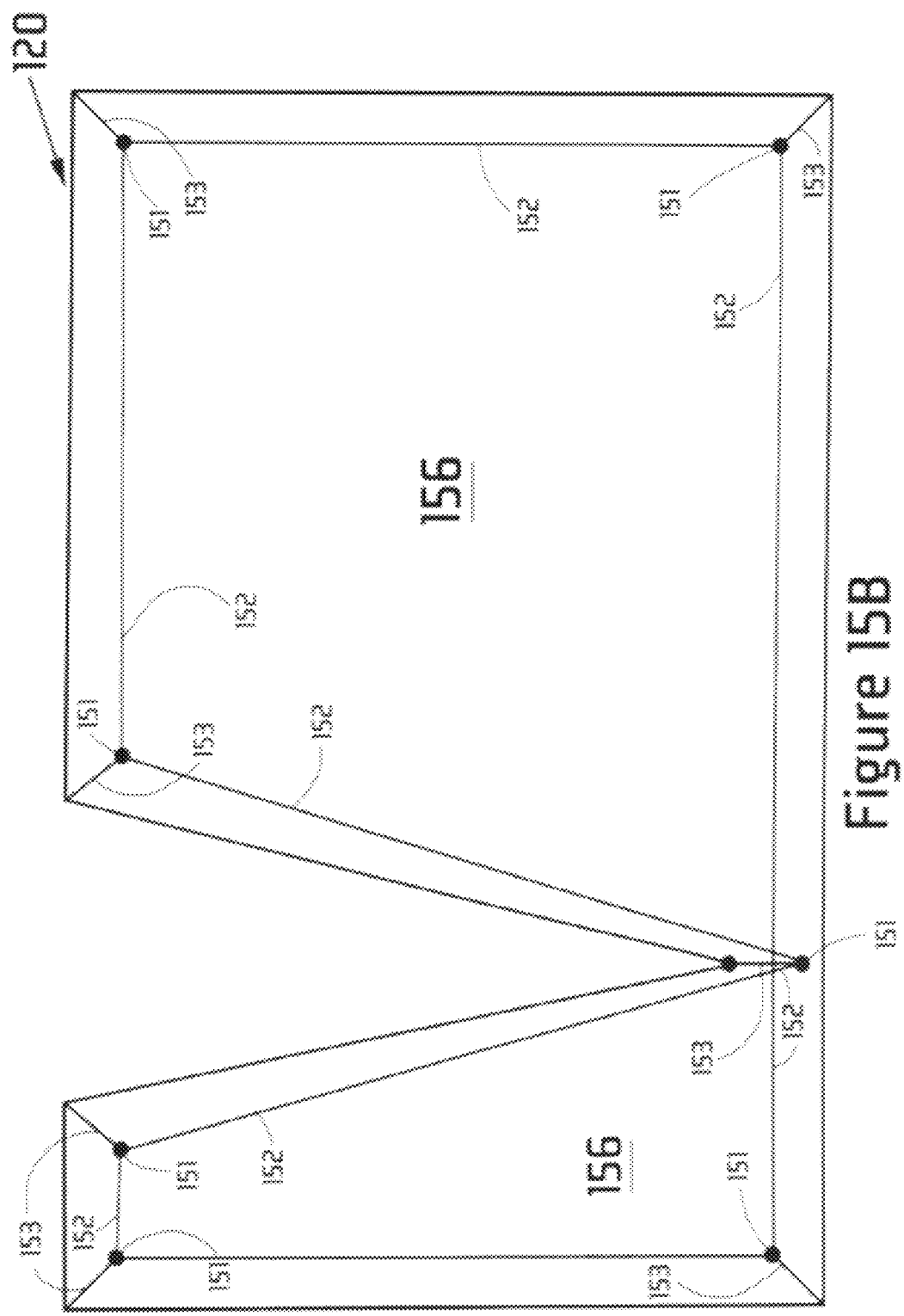

For example, in some embodiments, prior to generating lines which connect adjacent points 151, the distance separating each of the points 151 and the corresponding corner of side 120 may be reduced so that a set of rules is satisfied. The rules may include, for example, that each of lines 153 connecting each point 151 and the corresponding corner of side 120 do not intersect another of the lines 153. Another rule which may be included is that the lines 153 do not intersect a boundary of side 120. Other rules may additionally or alternatively be enforced. FIG. 15B is an illustration of side 120 of polygonal data object 110 showing points 151 where the distance separating each of the points 151 and the corresponding corner of side 120 have been reduced so that these rules are satisfied.

FIG. 15B additionally shows lines 152, where each line 152 connects adjacent points 151 around the perimeter of the side 120. Despite conforming to the rules discussed above, in this embodiment, the lines 152 define boundaries of multiple regions 156 which are farther from the boundaries of the side 120 than the lines 152.

Figure 15C:
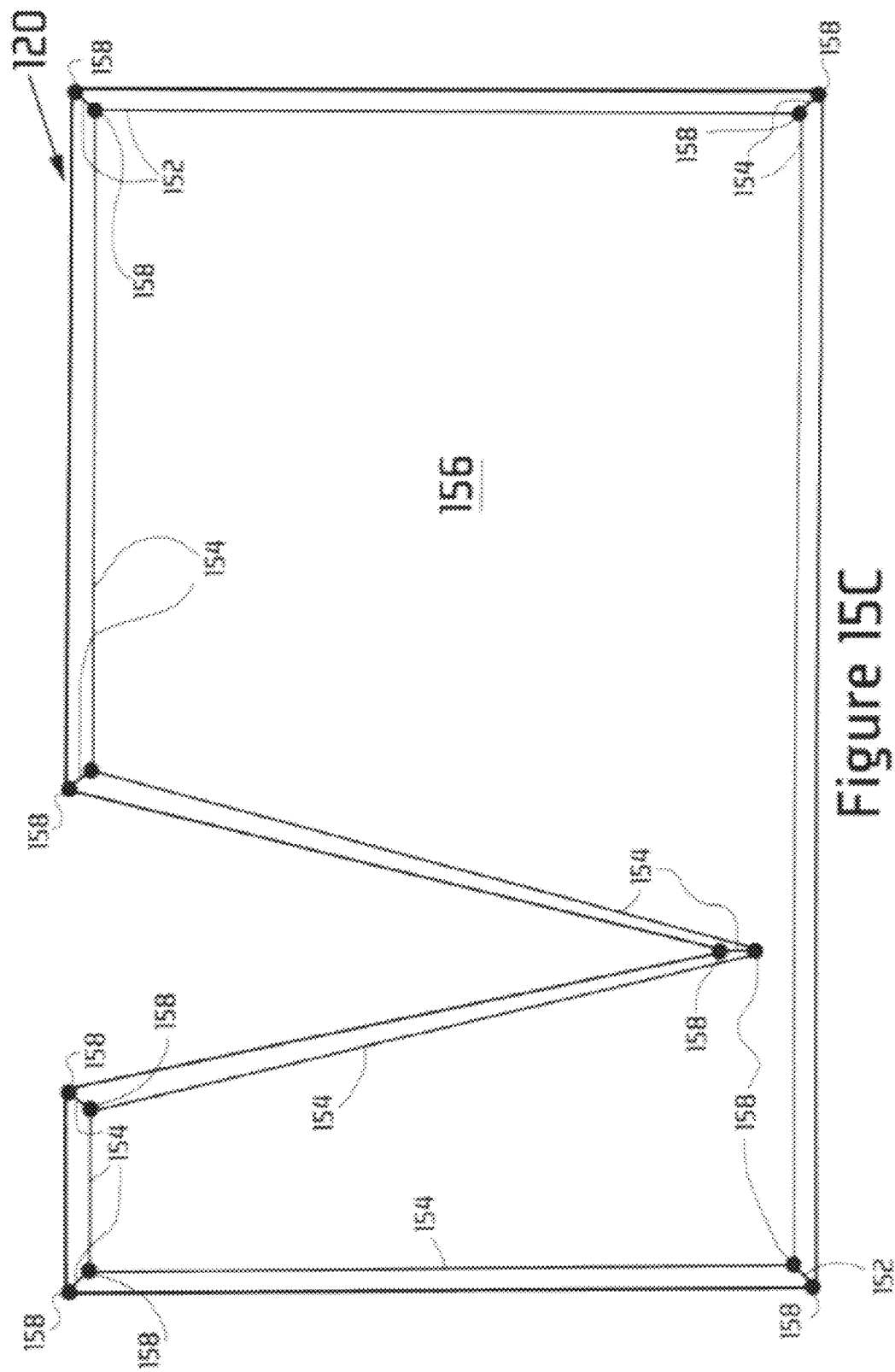

To cause a single region 156 to be generated or for another reason, additional rules may be enforced. Such additional rules may include, for example, that lines 152 do not intersect one another. Other rules may additionally or alternatively be used. For example, the length of lines 153 may be reduced to satisfy a rule based on, for example, relative widths of a minimum width of the single region 156 and a minimum width of a distance between a line 152 and a boundary of the side 120. In some embodiments, the computer system automatically reduces the length of lines 153 to conform to the rules. In some embodiments, in response to each of multiple indications from the user, the distance is reduced incrementally, such that the extent of the reduction is determined by the user. FIG. 15C is an illustration of side 120 of polygonal data object 110 showing the position of points 151 and lines 152 after lines 153 have been further reduced. As shown, a single region 156 is generated.

Figure 15D:
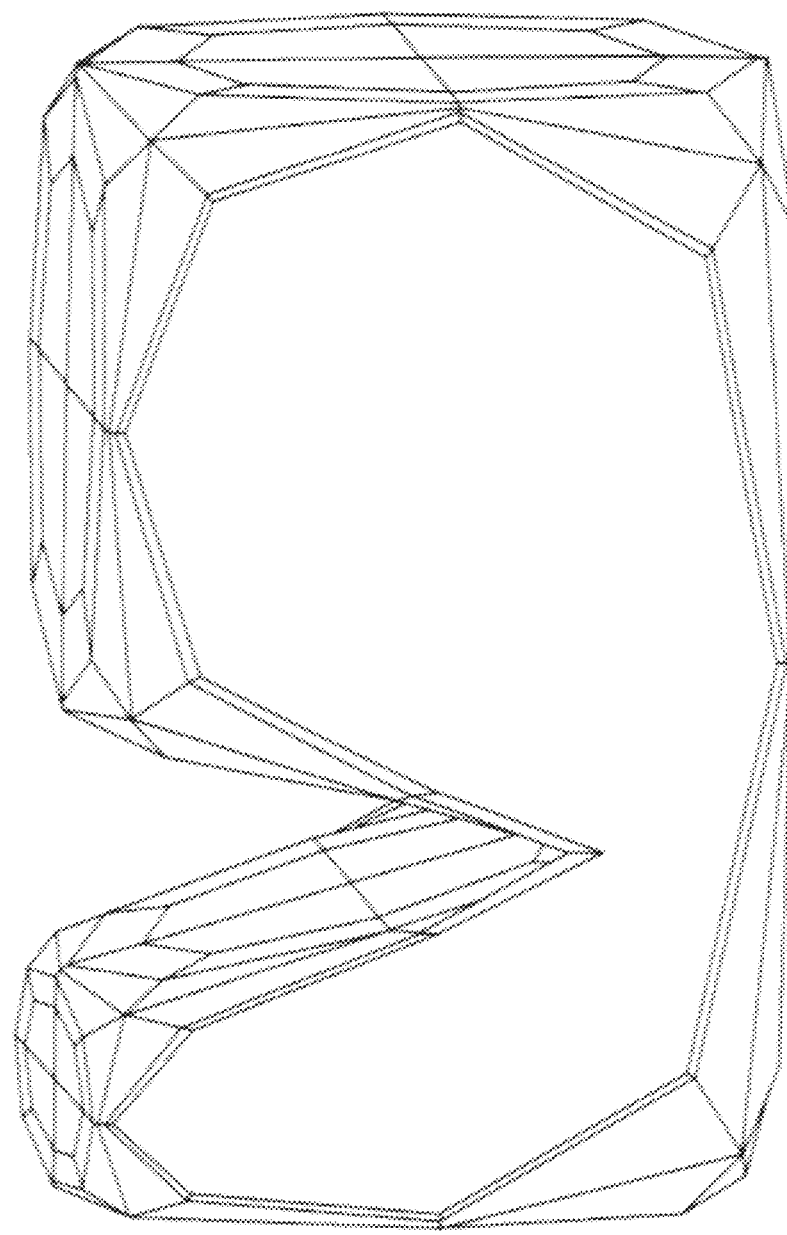

In some embodiments, additional edges 154 and additional vertices 158 are generated which bound the region 156 and connect vertices 158 to vertices of the corners of the boundary of side 120, for example, as discussed above. Once the additional edges 154 and vertices 158 are generated, surfaces to be constrained are determined by a method such as that discussed above. For example, in this embodiment, the single surface corresponding to the region 156 may be constrained similarly to the constraining of surfaces discussed above. Following the constraining of the surface corresponding to the regions 156 and other surfaces of polygonal data object 110, smoothing and conforming operations are performed on polygonal data object 110. As shown in FIG. 15D, fillets are produced by the smoothing and conforming operations.

Figure 16A:
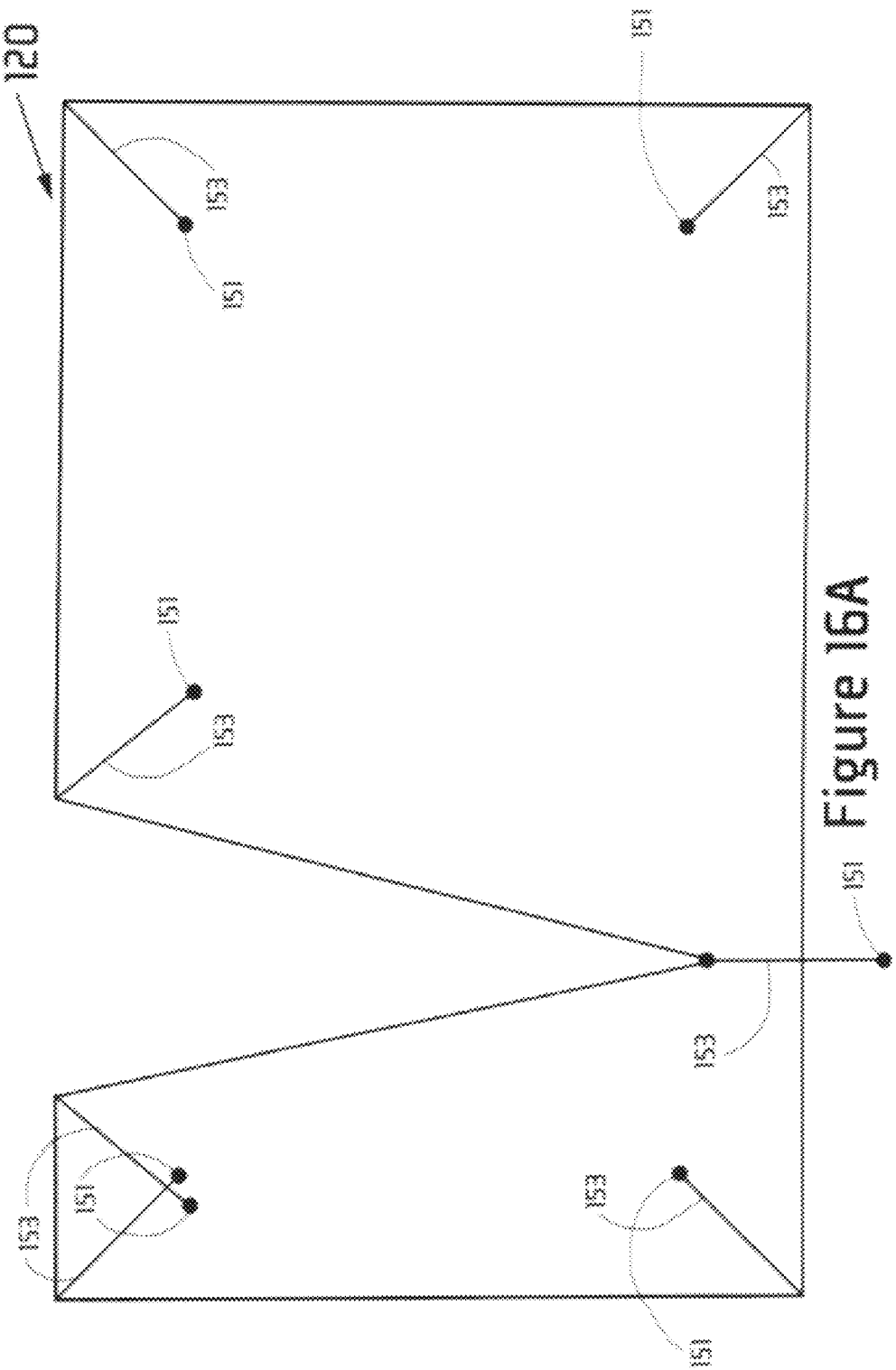
FIGS. 16A-16E are illustrations of polygonal data at various stages in another embodiment of a method of smoothing.

FIG. 16A is an illustration of side 120 of polygonal data object 110. In this embodiment, all edges of side 120 are to be filleted. Referring to FIG. 16A, points 151 are positioned a constant distance from each corner of side 120. In this embodiment, the points 151 are each placed at the end of one of multiple lines, where the lines have the same length. Each line starts at a corner of side 120 and extends toward the interior of the side 120 along a direction which bisects the angle of the corner. Similar to embodiments discussed above, a result of the positions of the points 151 is that multiple regions are defined which are farther from the boundaries of the side 120 than lines connecting the points. This may not be desirable.

If a single region which is farther from the boundaries of the side 120 is desired, or for another reason, the distance separating each of the points 151 and the corresponding corner of side 120 may be reduced. In some embodiments, in response to each of multiple indications from the user, the distance is reduced incrementally, such that the extent of the reduction is determined by the user. In some embodiments, the computer system automatically reduces the distance. The extent of the reduction may be determined automatically based on, for example, a set of rules.

Figure 16B:
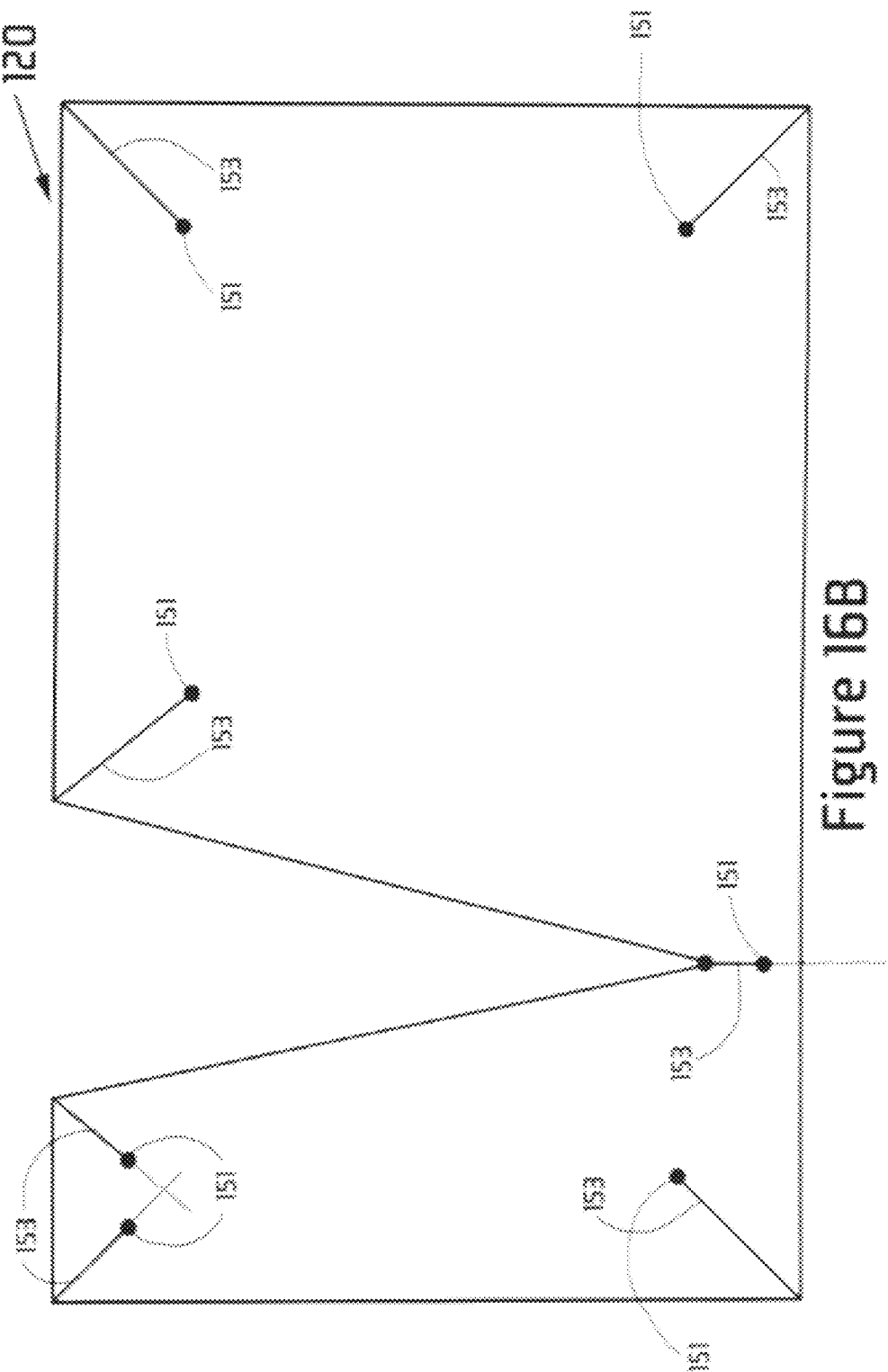

For example, in some embodiments, prior to generating lines which connect adjacent points 151, one or more of the distances separating each of the points 151 and the corresponding corner of side 120 may be reduced so that a set of rules is satisfied. The rules may include, for example, that each of lines 153 connecting each point 151 and the corresponding corner of side 120 do not intersect another of the lines 153. Another rule which may be included is that the lines 153 do not intersect a boundary of side 120. Other rules may additionally or alternatively be enforced. FIG. 16B is an illustration of side 120 of polygonal data object 110 showing points 151 where distances separating some of the points 151 and the corresponding corner of side 120 have been reduced so that these rules are satisfied. The dashed extensions of the reduced lines 153 indicate their lengths prior to reduction. In this embodiment lines 153 which cause one of the rules to be violated is reduced in length, and lines 153 which do not cause a rule to be violated are not reduced. Accordingly, the reduction of the length of the reduced lines 153 removes rule violations.

Figure 16C:
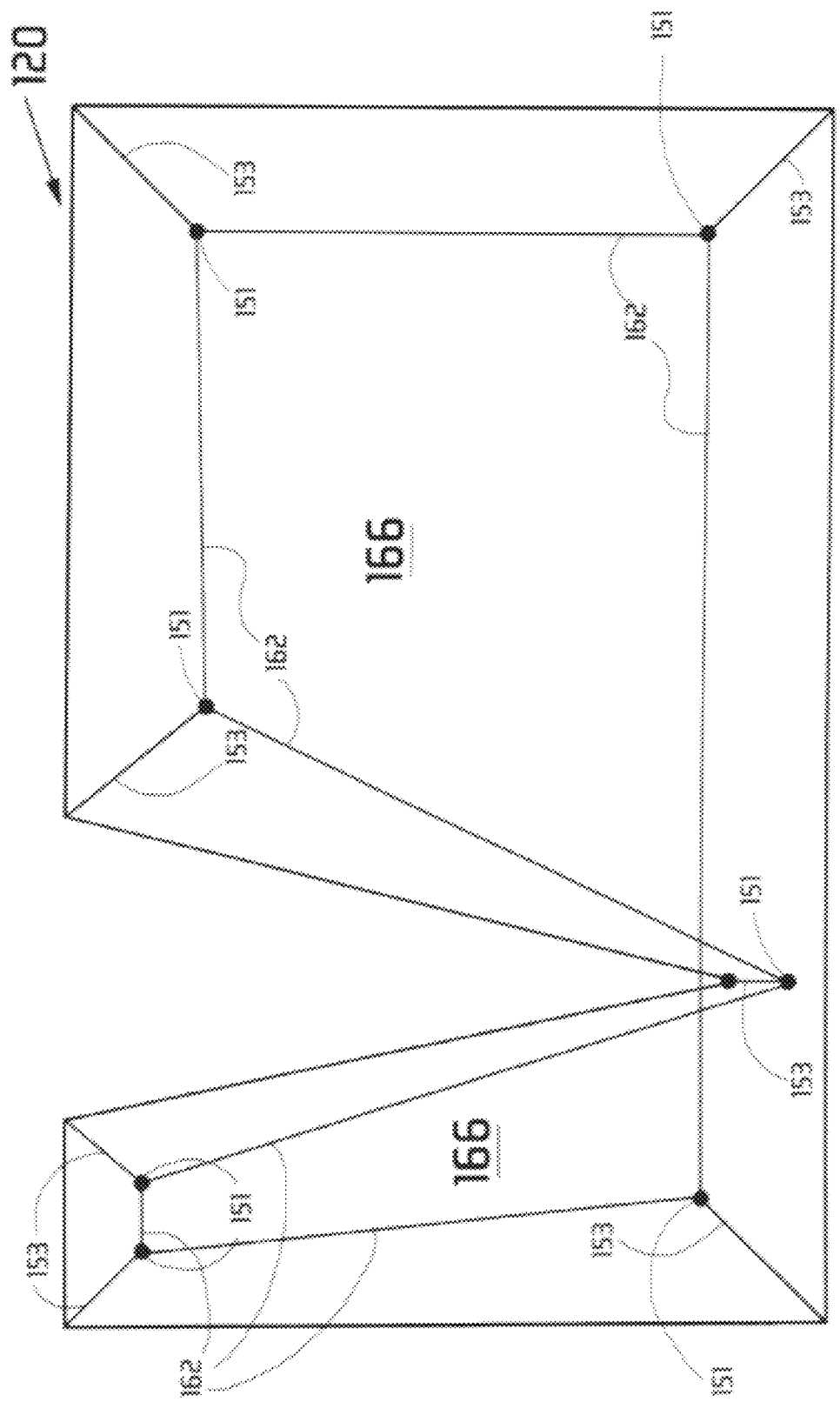

FIG. 16C shows lines 162, where each line 162 connects adjacent points 151 around the perimeter of the side 120. Despite conforming to the rules discussed above, in this embodiment, the lines 162 define boundaries of multiple regions 166 which are farther from the boundaries of the side 120 than the lines 162.

Figure 16D:
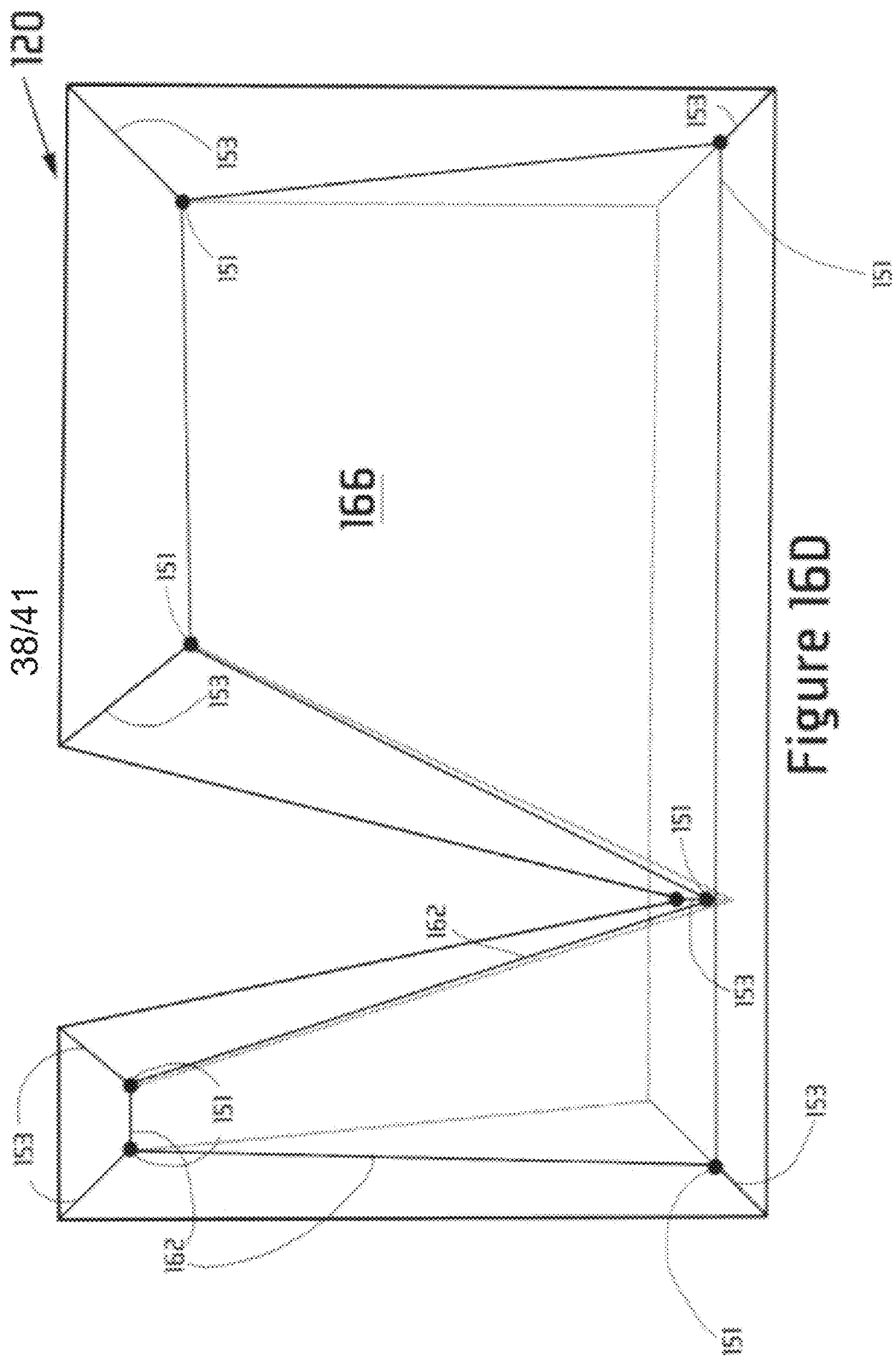

To cause a single region 166 to be generated or for another reason, additional rules may be enforced. Such additional rules may include, for example, that lines 162 do not intersect one another. Other rules may additionally or alternatively be used. For example, a geometry such as one of the lines 162, points 152, and/or 153 may be adjusted to satisfy a rule based on, for example, relative widths of a minimum width of the single region 166 and a minimum width of a distance between a line 162 and a boundary of the side 120. In some embodiments, the computer system automatically adjusts a geometry to conform to the rules in response to an indication from the user. In some embodiments, in response to each of multiple indications from the user, the geometry is adjusted incrementally, such that the extent of the adjustment is determined by the user. In some embodiments, adjusting the geometry includes one or more of: reducing the length of one or more of the lines 153, moving one or more of the vertices along a path defined by one of the lines 162, moving one or more of the vertices along a path parallel to a boundary of side 120 or according to another geometry of polygonal data object 110, moving a line 162, for example perpendicular to its position prior to movement, and pivoting a line 153 about its intersection with the boundary of side 120. Other geometry adjustments may alternatively or additionally be made. FIG. 16D is an illustration of side 120 of polygonal data object 110 showing the position of points 151, lines 153, and lines 162 after certain geometrics have been adjusted to conform to the rules.

Figure 16E:
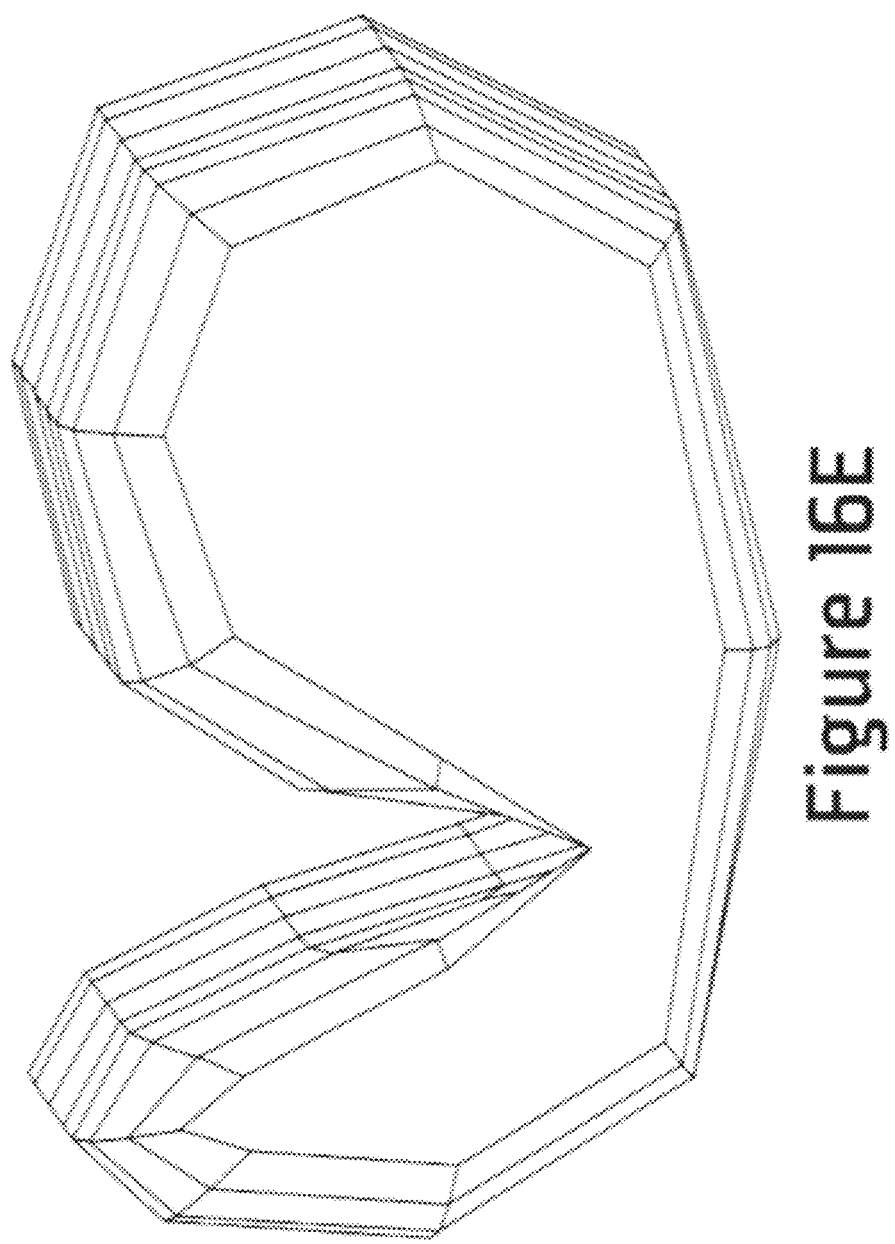

In some embodiments, additional edges and additional vertices are generated which bound the region 166, for example, as discussed above. Once the additional edges and vertices are generated, surfaces to be constrained are determined by a method such as that discussed above. For example, in this embodiment, the single surface corresponding to the region 166 may be constrained similarly to the constraining of surfaces discussed above. Following the constraining of the surface corresponding to the region 166 and other surfaces of polygonal data object 110, smoothing and conforming operations are performed on polygonal data object 110. As shown in FIG. 16E, fillets are produced by the smoothing and conforming operations.

As shown in FIG. 16E, the fillets in the notch of polygonal data object 110 taper such that they are much larger at the top of the notch as compared to the bottom of the notch. Such gradual tapering may be undesirable. In addition, for various other reasons, undesirable fillets may be generated. In some embodiments, one or more additional vertices are added prior to performing the smoothing and conforming operations to produce more desirable fillets. For example, additional vertices may be added if the angle of a notch, such as that shown in FIG. 16E has an angle of less than about 90 degrees, about 45 degrees, about 30 degrees, about 15 degrees, about 10 degrees, or another threshold.

FIG. 17A is an illustration of side 120 of polygonal data object 110 showing additional vertices 170. As shown, the additional vertices 170 influence the positions of the lines 172, which connect additional vertices 170 and preexisting vertices 151. In some embodiments, the positions of the additional vertices 170 are determined by a designer, who provides a signal to the computer system indicating the location for the additional vertices 170.

In some embodiments, the computer system automatically determines the positions of the additional vertices 170. For example, the computer system may add the vertices 170 along the edges which connect preexisting vertices 151 at locations which are closest to the boundary of the side 120. Alternatively the additional vertices 170 may be added along the edges which connect preexisting vertices 151 at locations which are a determined distance from a preexisting vertex nearest the point closest to the boundary. The determined distance, may, for example, be equal to or a multiple of the distance between the boundary and the preexisting vertex nearest the point closest to the boundary. Other methods may be used to determine the locations of the additional vertices 170 on the edges which connect preexisting vertices 151.

Once added, the additional vertices 170 may then be moved away from the boundary in a direction defined, for example, by a line between each additional vertex 170 and the point along the boundary to which it is closest. Alternatively, the direction may be determined by, for example, a line between each additional vertex 170 and a nearest corner of the boundary. Other directions may be used.

The distance between the moved additional vertex 170 and the point on the boundary along the line of movement may be substantially equal to, for example, the distance between the preexisting vertex 151 nearest the moved additional vertex 170 and the boundary. Alternatively, the distance between the moved additional vertex 170 and the point on the boundary along the line of movement may be substantially equal to, for example, the distance between another preexisting vertex 151 and the boundary. In some embodiments, the distance between the moved additional vertex 170 and the point on the boundary along the line of movement is a multiple of a distance between a preexisting vertex 151 and the boundary. Other distances may be used.

In some embodiments, other methods are used to determine the positions of the additional vertices 170. For example, the additional vertices may be positioned such that the preexisting vertex 151 nearest the additional vertex 170, the point on the boundary at the tip of the notch, and the additional vertex 170 substantially form an equilateral triangle, or a triangle of another desired characteristic, such as a 30-60-90 triangle.

FIG. 17B is an illustration of the polygonal data object having fillets generated after the addition of vertices 170. As shown, the fillets of FIG. 17B are different from the fillets shown in FIG. 16E because of the additional vertices 170.

The various aspects, processes, and actions discussed herein may be performed sequentially or in parallel. For example, a system capable of parallel processing may divide certain procedures among the available processing devices. In addition, the various aspects, processes, and actions may be performed automatically or algorithmically by the computer system according to a program running on the computer system.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, certain aspects, processes, and actions may be omitted, and other aspects, processes, and actions may be added.

What is claimed is:

1. A computer implemented method of producing an electronic geometric model, the method comprising:
   accessing electronic data by computer, the data comprising polygonal data defining a reference object and a polygonal data object comprising a mesh of polygonal data points, the polygonal data object comprising a plurality of edges;
   selecting by computer an edge of the polygonal data object for filleting; and in response to an indication from a user:
   determining locations for additional data points by computer, wherein the locations are adjacent to the selected edge and contact portions of the reference object,
   Inserting by computer the additional data points into the accessed data at the determined locations;
   defining by computer a first line parallel to the selected edge with the additional points;
   Identifying by computer a face bounded in part by the first line and the selected edge;
   determining by computer the number of sides of the face;
   modifying by computer the face to have exactly four sides if the face has more or fewer than four sides, wherein after modification of the face, the first line, the selected edge, and two other sides collectively define the four sides of the face;

subdividing the accessed data having the additional data points by computer with a subdivision algorithm, whereby subdivided data is generated;

generating by computer the geometric model based on the subdivided data; and storing the geometric model in a computer readable data storage, wherein the additional points define first and second lines, and wherein the selected edge is between the first and second line.

2. The method of claim 1, wherein subdividing the accessed data comprises generating points defining a fillet.

3. The method of claim 1, further comprising receiving an instruction including distance information between the selected edge and the additional points, and the additional points are positioned according to the distance information.

4. The method of claim 1, wherein the additional points further define a second line, and wherein the second line is parallel to the selected edge and the selected edge is between the first and second lines.

5. The method of claim 4, wherein the selected edge is equidistant from the first and second lines.

6. The method of claim 1, further comprising:
selecting a plurality of edges; and
inserting additional data points into the accessed data adjacent to the plurality of selected edges.

7. The method of claim 6, wherein the plurality of edges define a selected curve in the accessed data.

8. The method of claim 7, wherein the additional points define first and second curves, and wherein the first and second curves are parallel to the selected curve and the selected curve is between the first and second curves.

9. The method of claim 1, wherein the additional points comprise a pair of points.

10. The method of claim 9, further comprising:
generating a second line extending from the selected edge to a first one of points of the pair of points; and
generating a third line extending form the selected edge to a second one of the points of the pair of point.

11. The method of claim 10, wherein the second line and the third line are the same length.

12. The method of claim 11, wherein the face is defined at least in part by the selected edge, the first line, the second line, and the third line.

13. The method of claim 12, wherein the length of the second and third lines is determined according to at least one of a user request, and at least one rule.

14. The method of claim 13, wherein the at least one rules includes at least one of a prohibition on the intersection of the second and third lines; and a prohibition on the intersection of one or both of the first and second lines with one or more of the edges of the polygonal data object other than the selected edge.

15. The method of claim 1, wherein the polygonal data object comprises the reference object.

* * * * *